(12) United States Patent
Sposili et al.

(10) Patent No.: US 6,908,835 B2
(45) Date of Patent: Jun. 21, 2005

(54) METHOD AND SYSTEM FOR PROVIDING A SINGLE-SCAN, CONTINUOUS MOTION SEQUENTIAL LATERAL SOLIDIFICATION

(75) Inventors: Robert S. Sposili, Portland, OR (US); James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 10/311,485

(22) PCT Filed: Apr. 19, 2001

(86) PCT No.: PCT/US01/12799
§ 371 (c)(1),
(2), (4) Date: Sep. 22, 2003

(87) PCT Pub. No.: WO02/086954
PCT Pub. Date: Oct. 31, 2002

(65) Prior Publication Data
US 2004/0053450 A1 Mar. 18, 2004

(51) Int. Cl.⁷ .......................... H01L 21/36; H01L 21/20
(52) U.S. Cl. ....................................... 438/487; 438/481
(58) Field of Search ................................ 438/487–488, 438/489, 490, 491, 483, 485, 486, 481, 478, 479, 480

(56) References Cited

U.S. PATENT DOCUMENTS

| | | | |
|---|---|---|---|
| 4,309,225 A | | 1/1982 | Fan et al. |
| 5,145,808 A | * | 9/1992 | Sameshima et al. .......... 117/44 |
| 5,591,668 A | | 1/1997 | Maegawa et al. |

(Continued)

FOREIGN PATENT DOCUMENTS

| | | |
|---|---|---|
| EP | 0681316 | 11/1995 |
| GB | 2338342 A | 12/1999 |

(Continued)

OTHER PUBLICATIONS

Im et al., "Phase Transformation Mechanisms Involved in Excimer Laser Crystallization of Amorphous Silicon Films," Appl. Phys. Lett., vol. 63 (14), p. 1969 (1993).
Im et al., "On the Super Lateral Growth Phenomenon (Continued)

Primary Examiner—Chandra Chaudhari
Assistant Examiner—William Vesperman
(74) Attorney, Agent, or Firm—Baker Botts L.L.P.

(57) ABSTRACT

A method and system for processing a silicon thin film sample on a substrate. The substrate has a surface portion that does not seed crystal growth in the silicon thin film. The film sample has a first edge and a second edge. An irradiation beam generator is controlled to emit successive irradiation beam pulses at a predetermined repetition rate. Each of the irradiation beam pulses is masked to define a first plurality of beamlets and a second plurality of beamlets, the first and second plurality of beamlets of each of the irradiation pulses being provided for impinging the film sample and having an intensity which is sufficient to melt irradiated portions of the film sample throughout their entire thickness. The film sample is continuously scanned, at a constant predetermined speed, so that a successive impingement of the first and second beamlets of the irradiation beam pulses occurs in a scanning direction on the film sample between the first edge and the second edge. During the continuous scanning of the film sample, a plurality of first areas of the film sample are successively irradiated using the first beamlets of the irradiation beam pulses so that the first areas are melted throughout their thickness and leaving unirradiated regions between respective adjacent ones of the first areas. Also during the continuous scanning, each one of the first areas irradiated using the first beamlets of each of the irradiation beam pulses is allowed to re-solidify and crystalize. During resolidification and crystallization of the first areas, a plurality of second areas of the film sample are successively irradiated using the second beamlets of the irradiation beam pulses so that the second areas are melted throughout their thickness. Each of the second areas partially overlaps a respective pair of the re-solidified and crystalized first areas and the respective unirradiated region therebetween.

24 Claims, 24 Drawing Sheets

U.S. PATENT DOCUMENTS

| | | | |
|---|---|---|---|
| 5,766,989 A * | 6/1998 | Maegawa et al. | 438/166 |
| 5,893,990 A | 4/1999 | Tanaka | |
| 6,117,752 A * | 9/2000 | Suzuki | 438/487 |
| 6,169,014 B1 * | 1/2001 | McCulloch | 438/487 |
| 6,177,301 B1 * | 1/2001 | Jung | 438/150 |
| 6,635,554 B1 * | 10/2003 | Im et al. | 438/482 |

FOREIGN PATENT DOCUMENTS

| | | |
|---|---|---|
| GB | 2338343 A | 12/1999 |
| GB | 2338597 A | 12/1999 |
| WO | WO 97/45827 | 12/1997 |
| WO | WO 01/18854 | 3/2001 |
| WO | WO 01/18855 | 3/2001 |

OTHER PUBLICATIONS

Observed in Excimer Laser–Induced Crystallization of Thin Si Films," Appl. Phys. Lett., vol. 64 (17), p. 2303 (1994).

Sposili et al., "Sequential Lateral Solidifiction of Thin Silicon Films on SiO2," Appl. Phys. Lett., vol. 69 (19), p. 2864 (1996).

Im et al., "Single–Crystal Si Films for Thin–Film Transistor Devices," Appl. Phys. Lett., vol 70 (25), p. 3434 (1997).

Sposili et al., "Single–Crytal Si Films Via A Low–Substrate–Temperature Excimer–Laser Crystallizaiton Method," Mat. Res. Symp. Proc., vol. 452, p. 953 (1997).

Crowder et al., "Low–Temperature Single–Crystal; Si TFT's Fabricated on Si Films Processed Via Sequential Lateral Solidification," IEEE Electron Device Letter, vol. 19 (8), p. 306 (1998).

Im et al., "Controlled Super–Lateral Growth of Si Films for Microstructural Manipulaiton and Optimization," Phys. Stat. Sol. (a), vol. 166, p. 603 (1998).

Nebel, C.E., "Laser Interference Structuring of a–Si:H" Amorphous Silicon Technology, 1996. San Francisco, CA, Apr. 8–12, 1996, Materials Research Society Symposium Proceedings, vol. 420, Pittsburgh, PA: MRS, US, vol. 420, Apr. 8, 1996, pp. 117–128 XP000871547, ISBN: 1–55899–323–1, figure 2, by the International Search Authority in corresponding International Application No. PCT/US01/12799.

Jeon et al., "Two–step Laser Recrystallization of Poly–Si for Effective Control of Grain Boundaries," Journal of Non–crystalline Solids, North–Holland Publishing Company, Amsterdam, NL, vol. 266–269, (May 2000), pp. 645–649, XP004198581, ISSN: 0022–3093, abstract, by the International Search Authority in corresponding International Application No. PCT/US01/12799.

* cited by examiner

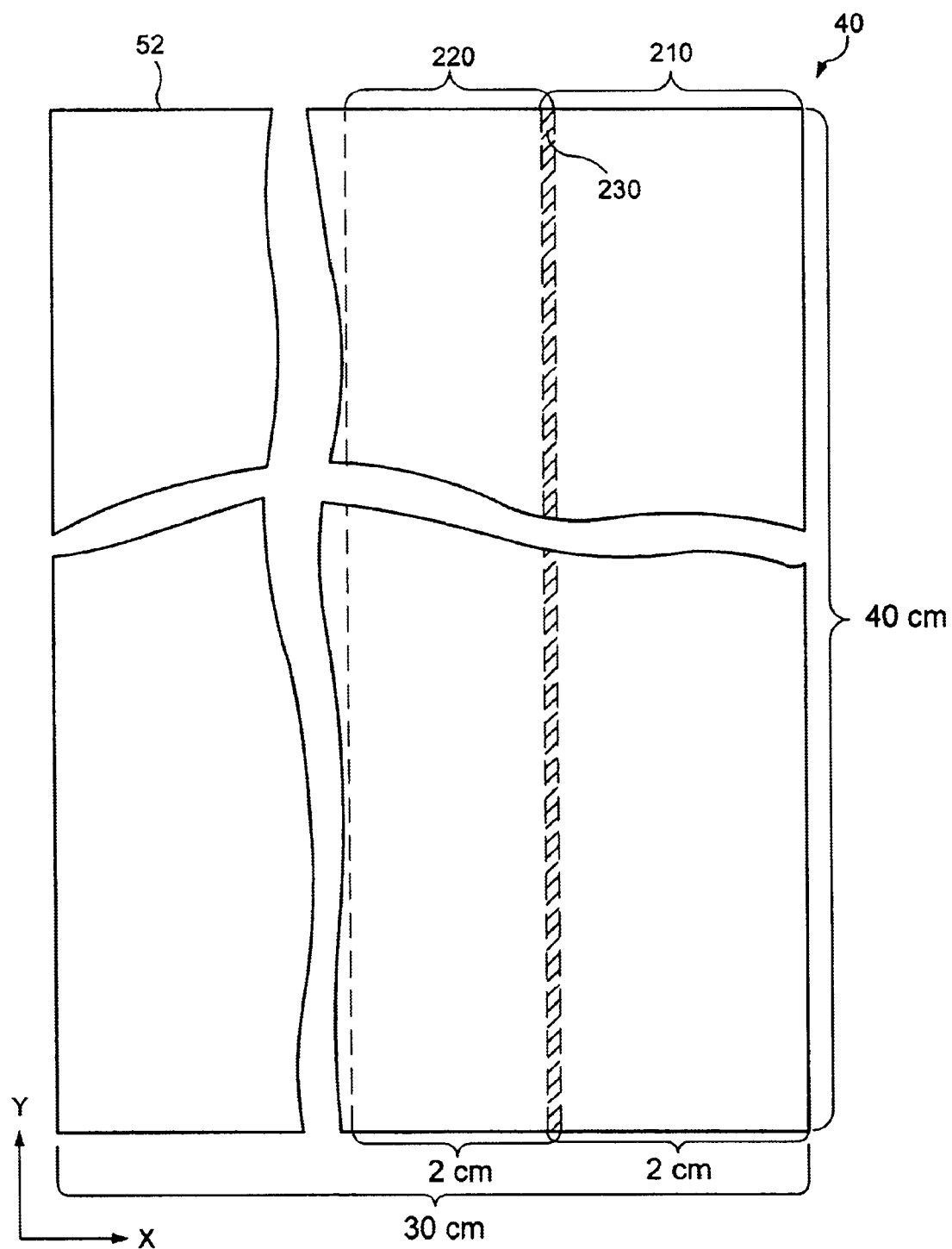
F I G. 2

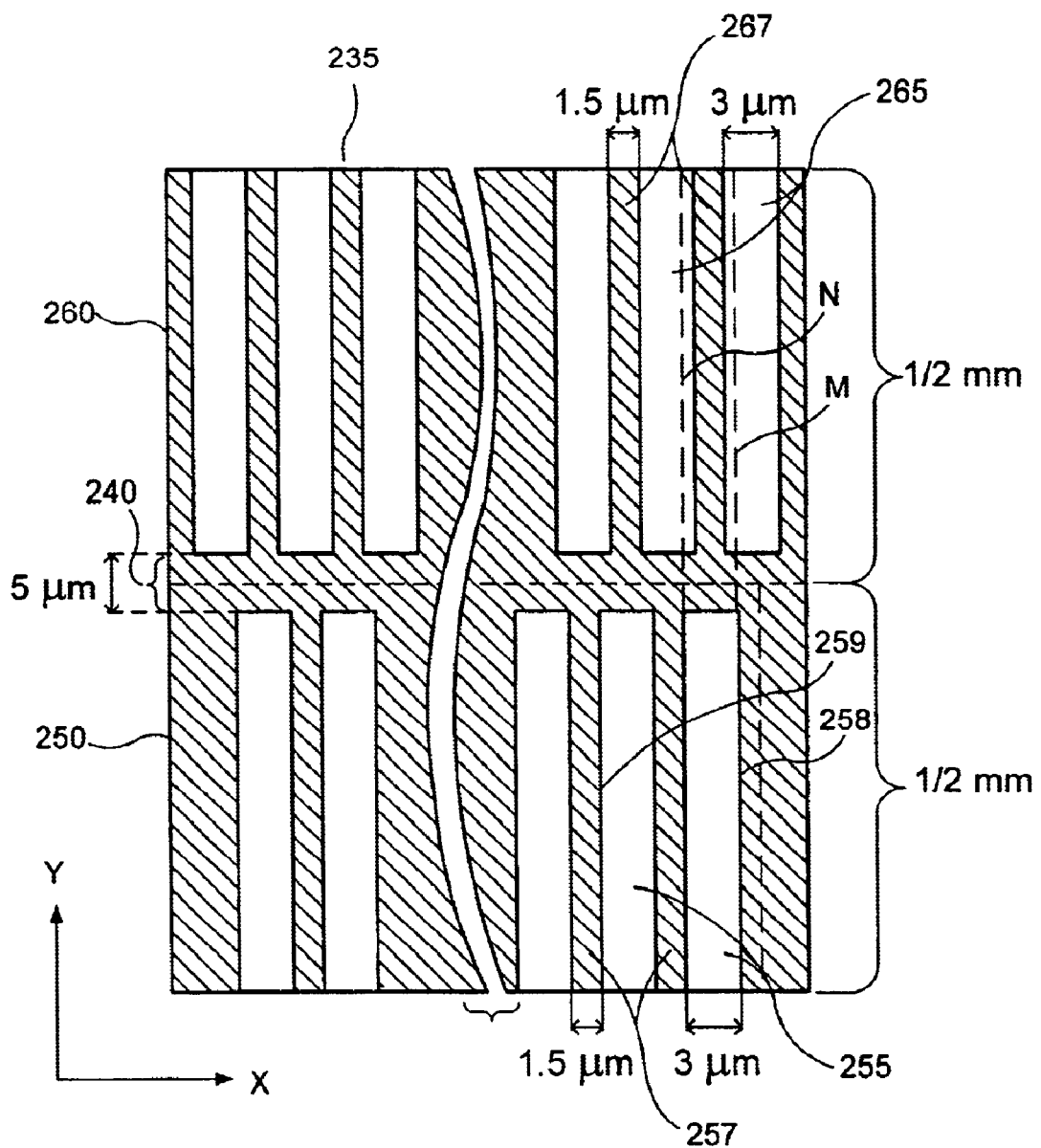
F I G. 3

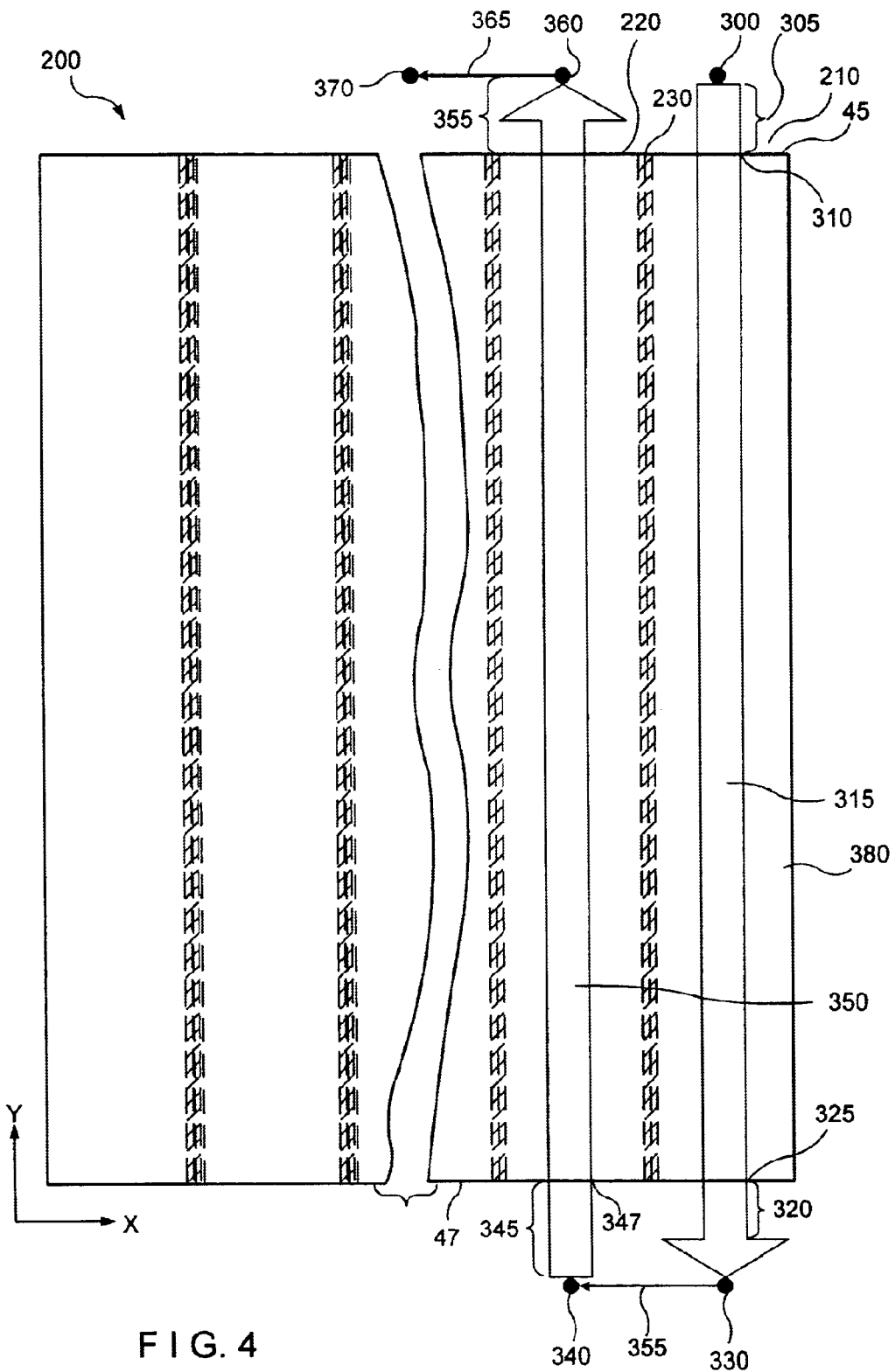
F I G. 4

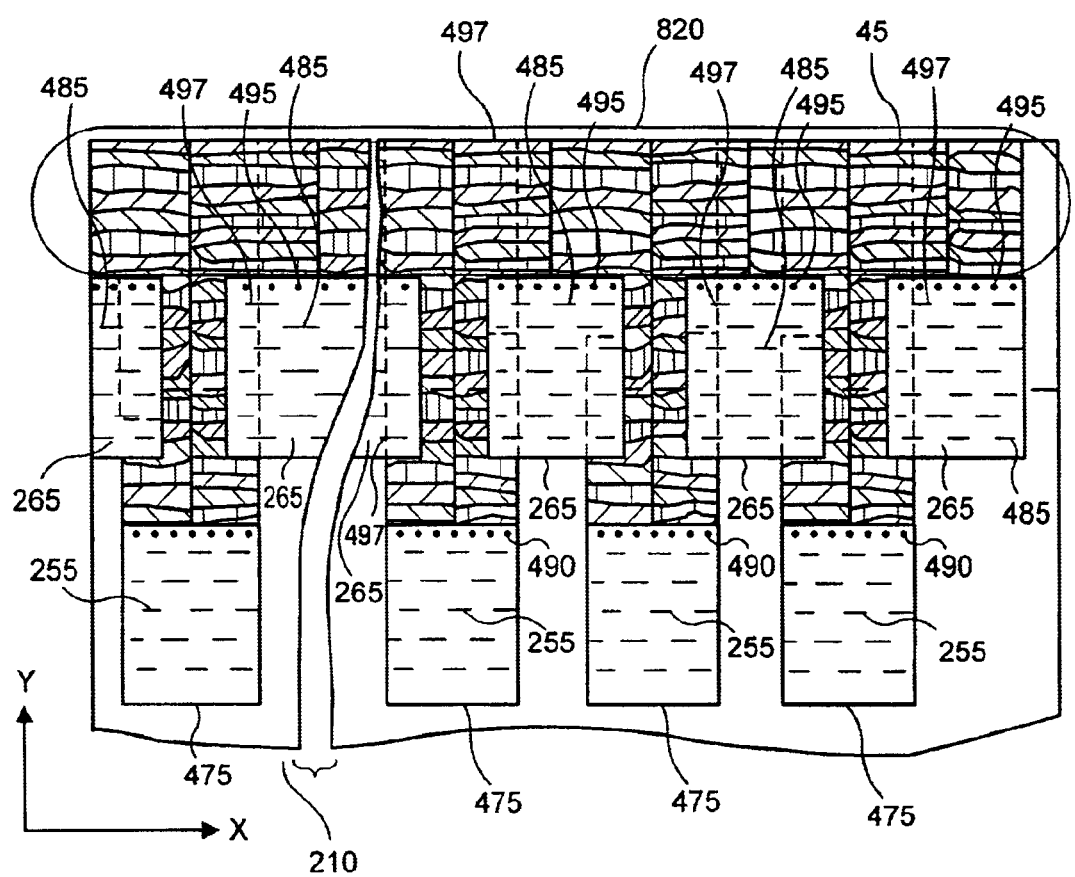
F I G. 5E

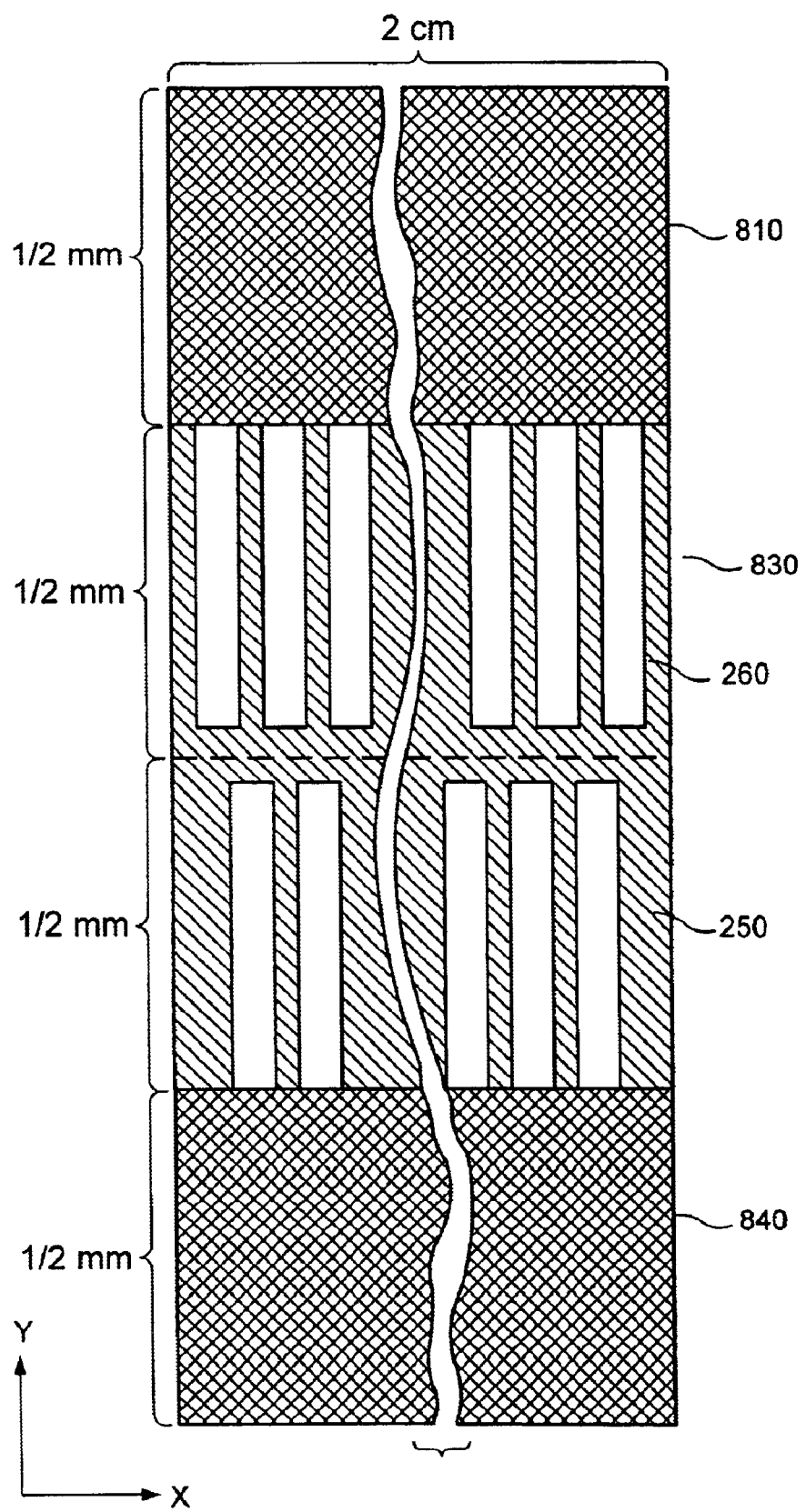
F I G. 12

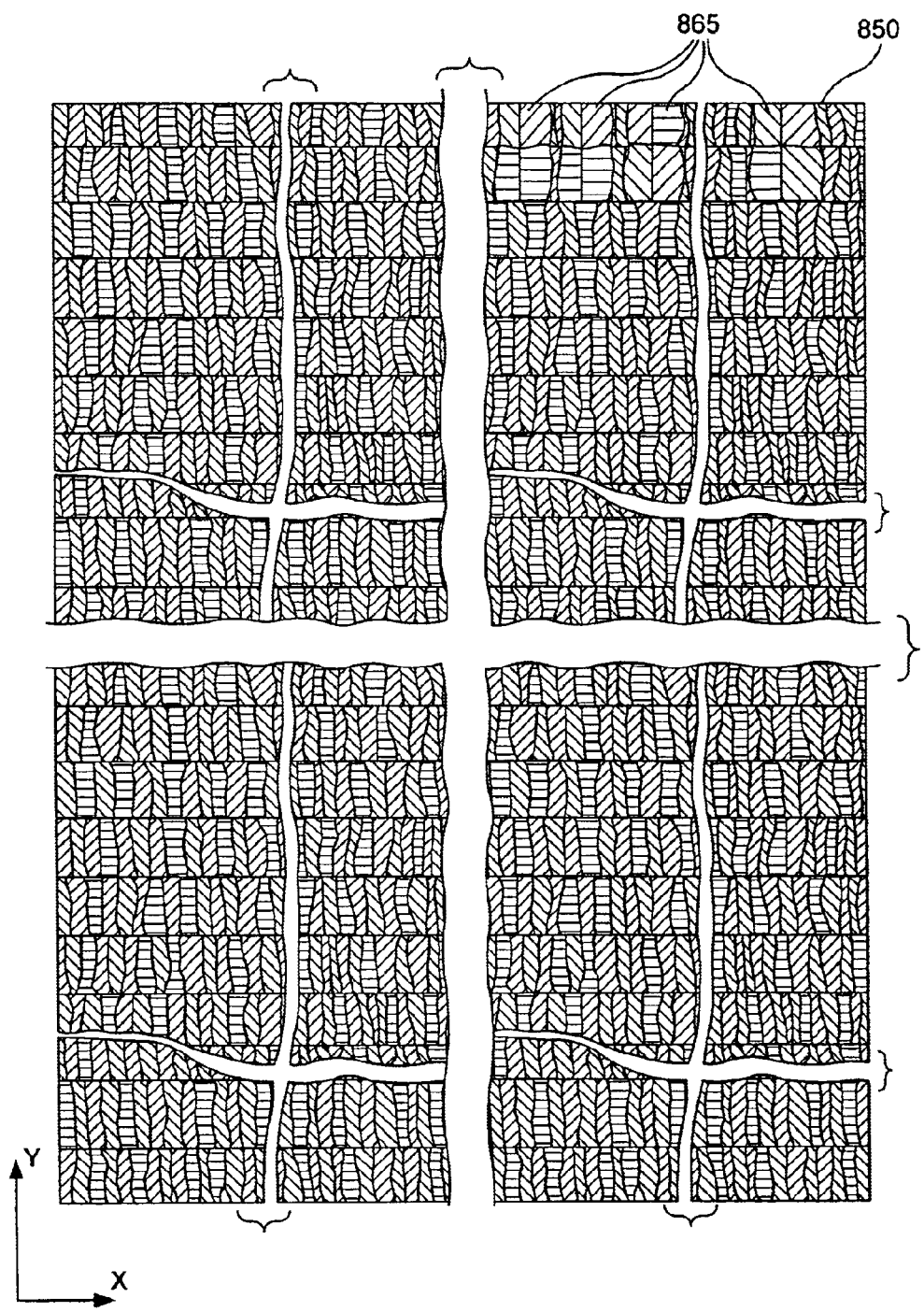
F I G. 13B

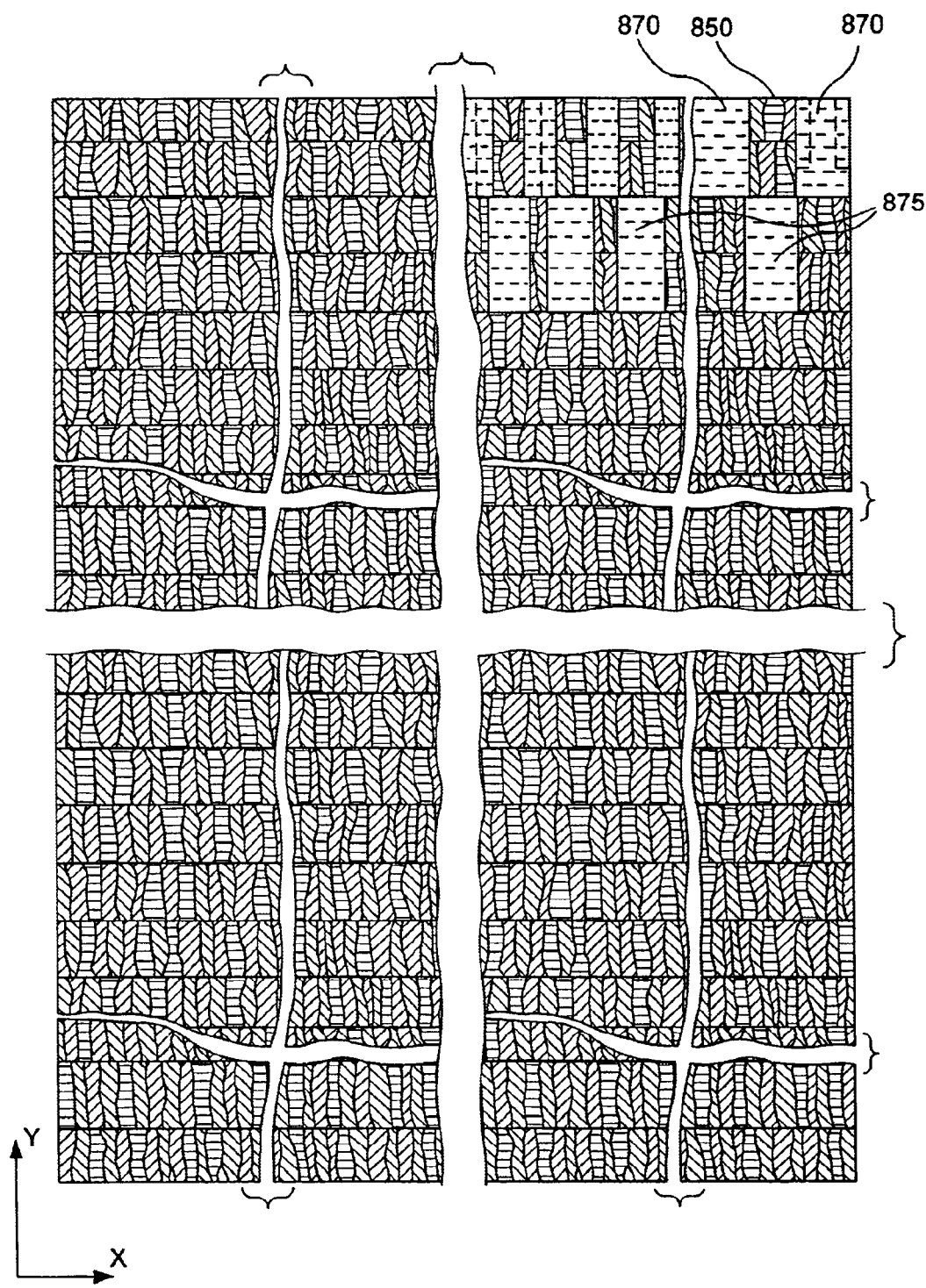
F I G. 13C

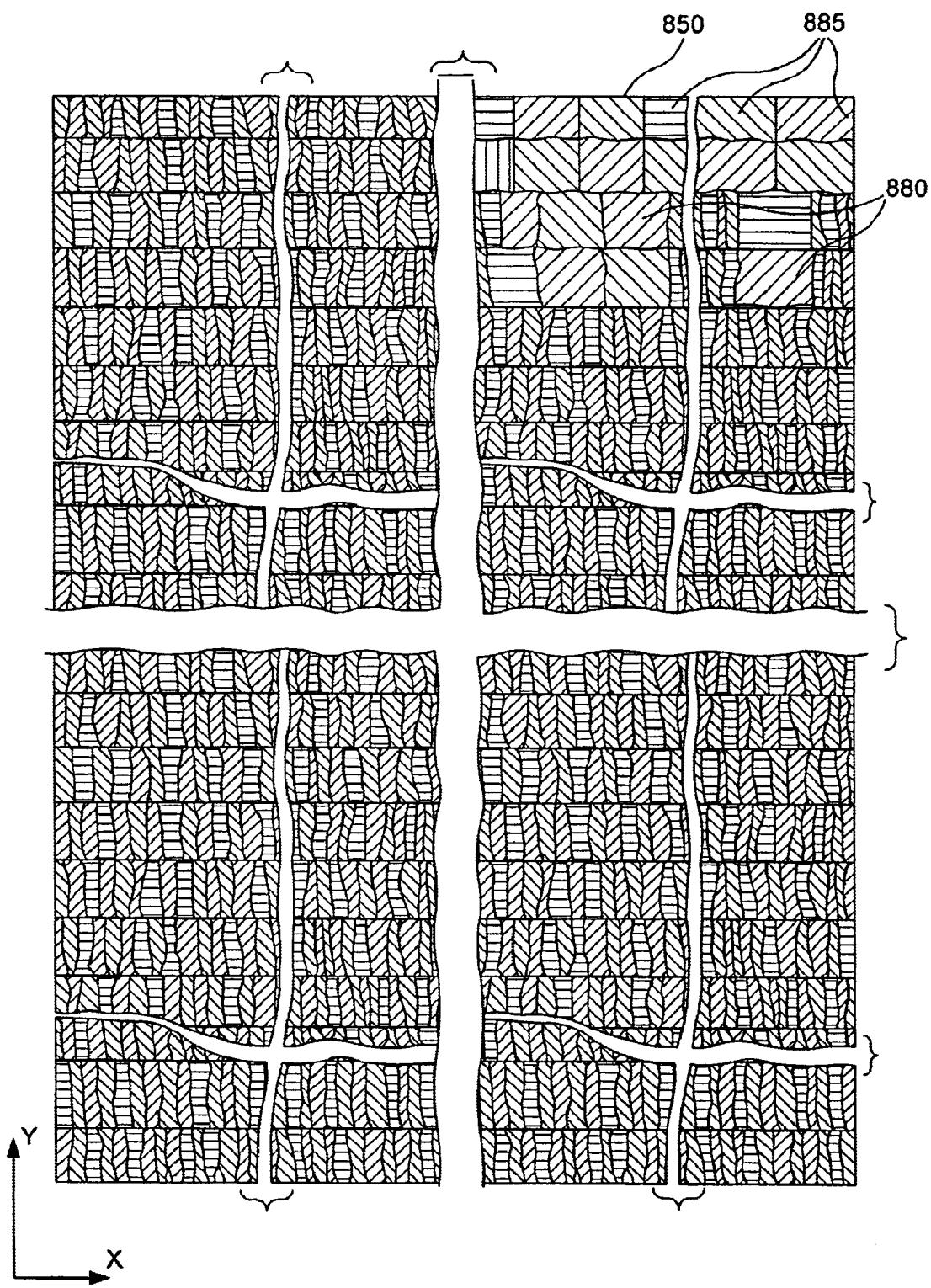
F I G. 13D

METHOD AND SYSTEM FOR PROVIDING A SINGLE-SCAN, CONTINUOUS MOTION SEQUENTIAL LATERAL SOLIDIFICATION

FIELD OF THE INVENTION

The present invention relates to a method and system for processing a thin-film semiconductor material, and more particularly to forming large-grained, grain-shaped and grain-boundary-location controlled semiconductor thin films from amorphous or polycrystalline thin films on a substrate using laser irradiation and a continuous motion of the substrate having the semiconductor film being irradiated.

BACKGROUND INFORMATION

In the field of semiconductor processing, there have been several attempts to use lasers to convert thin amorphous silicon films into polycrystalline films. For example, in James Im et al., "Crystalline Si Films for Integrated Active-Matrix Liquid-Crystal Displays," 11 MRS Bulletin 39 (1996), an overview of conventional excimer laser annealing technology is described. In such conventional system, an excimer laser beam is shaped into a beam having an elongated cross-section which is typically up to 30 cm long and 500 micrometers or greater in width. The shaped beam is stepped over a sample of amorphous silicon (i.e., by translating the sample) to facilitate melting thereof and to effectuate the formation of grain-shape and grain boundary-controlled polycrystalline silicon upon the re-solidification of the sample.

The use of conventional laser annealing technology to generate polycrystalline silicon is problematic for several reasons. First, the polycrystalline silicon generated in the process is typically small grained, of a random micro structure (i.e., poor control of grain shapes and grain boundary locations), and having a nonuniform grain size, therefore resulting in poor and nonuniform devices and accordingly, low manufacturing yield. Second, in order to obtain acceptable quality grain-shape and grain-boundary-location controlled polycrystalline thin films, the manufacturing throughput for producing such thin films must be kept low. Also, the process generally requires a controlled atmosphere and preheating of the amorphous silicon sample, which leads to a reduction in throughput rates. Accordingly, there exists a need in the field for a method and system for growing amorphous or polycrystalline thin semiconductor films to produce higher quality thin polycrystalline or single crystalline semiconductor silicon films at greater throughput rates. There likewise exists a need for manufacturing techniques which generate larger and more uniformly micro-structured polycrystalline silicon thin films to be used in the fabrication of higher quality devices, such as thin film transistor arrays for liquid crystal panel displays.

SUMMARY OF THE INVENTION

An object of the present invention is to provide techniques for producing large-grained and grain-shape and grain-boundary, location controlled polycrystalline thin film semiconductors using a sequential lateral solidification ("SLS") process, and to generate such silicon thin films in an accelerated manner. Another object of the present invention is to effectuate such accelerated sequential lateral solidification of the polycrystalline thin film semiconductors provided on a simple and continuous motion translation of the semiconductor film, without the necessity of "microtranslating" the thin film, and re-irradiating the previously irradiated region in the direction which is the same as the direction of the initial irradiation of the thin film while the sample is being continuously translated.

At least some of these objects are accomplished with a method and system for processing a semiconductor thin film sample on a substrate. The substrate has a surface portion that does not seed crystal growth in the silicon thin film. The film sample has a first edge and a second edge. An irradiation beam generator is controlled to emit successive irradiation beam pulses at a predetermined repetition rate. Each of the irradiation beam pulses is masked to define a first plurality of beamlets and a second plurality of beamlets, the first and second plurality of beamlets of each of the irradiation pulses being provided for impinging the film sample and having an intensity which is sufficient to melt irradiated portions of the film sample throughout their entire thickness. The film sample is continuously scanned, at a constant predetermined speed, so that a successive impingement of the first and second beamlets of the irradiation beam pulses occurs in a scanning direction on the film sample between the first edge and the second edge. During the continuous scanning of the film sample, a plurality of first areas of the film sample are successively irradiated using the first beamlets of the irradiation beam pulses so that the first areas are melted throughout their thickness and leaving unirradiated regions between respective adjacent ones of the first areas. Also during the continuous scanning, each one of the first areas irradiated using the first beamlets of each of the irradiation beam pulses is allowed to re-solidify and crystalize. During resolidification and crystallization of the first areas, a plurality of second areas of the film sample are successively irradiated using the second beamlets of the irradiation beam pulses so that the second areas are melted throughout their thickness. Each of the second areas partially overlaps a respective pair of the re-solidified and crystalized first areas and the respective unirradiated region therebetween.

In another embodiment of the present invention, during the successive irradiation of the second areas by the second beamlets, third areas of the film sample are successively irradiated by the first beamlets to completely melt the third areas throughout their thickness, each of the third areas partially overlapping a respective one of the re-solidified and crystalized first areas and leaving further unirradiated regions between respective adjacent ones of the third areas. One of the first areas and one of the third areas may lie on a first line which is parallel to the scanning direction, and one of the second areas may lie of a second line which is parallel to the scanning direction. The first line preferably extends at an offset from the second line. Upon the successive irradiation of the third areas by the first beamlets, each one of the second areas irradiated by the first beamlets of each of the irradiation beam pulses can be allowed to re-solidify and crystalize.

According to another embodiment of the present invention, when the film sample is continuously scanned, each one of the third areas irradiated by the first beamlets of each of the irradiation beam pulses is allowed to re-solidify and crystalize.

After the irradiation of the second and third areas, a plurality of fourth areas of the film sample are successively irradiated by the second beamlets of the irradiation beam pulses so that the fourth areas are melted throughout their thickness, wherein each one of the fourth areas partially overlaps a respective pair of the re-solidified and crystalized third areas and the respective further unirradiated region therebetween.

In yet another embodiment of the present invention, the first edge is located on a side of the film sample which is opposite from a side of the film sample on which the second edge is located. In addition, the first and second impingements along the film sample is continued until the first impingement by the first set of patterned beamlets of the film sample and the second impingement by the second set of patterned beamlets of the film sample passes the second edge of the film sample. Thereafter, the film sample can be positioned so that the first and second sets of patterned beamlets impinge on at a first location outside of boundaries of the film sample with respect to the film sample, and then the film sample may be translated so that impingement of the first and second sets of patterned beamlets moves from the first location to a second location, the second location being outside of the boundaries of the film sample. Finally, the film sample can be maintained so that the patterned beamlets impinge on the second location until any vibration of the film sample is damped out. With this embodiment, a completed portion of the film sample having a predetermined width has preferably been irradiated and re-solidified, the film sample having a controlled crystalline grain growth in the entire completed portion.

In still another embodiment, the particular direction extends along a first path, the film sample is translated along a second path which is perpendicular to the first path. The successive impingement by the first and second beamlets of the irradiation beam pulses the film sample may pass the second edge of the film sample. After, the successive irradiation of the first and second areas, the film sample is positioned so that the first and second beamlets of the irradiation beam pulses impinge on at a first location outside of boundaries of the film sample with respect to the film sample. Thereafter, the film sample can be positioned so that the successive impingement of the first and second beamlets with respect to the film sample moves from the first location to a second location, the second location being outside of the boundaries of the film sample. A completed portion of the film sample having a predetermined width which has been irradiated, melted throughout its entire thickness and re-solidified can be defined, with the film sample having a controlled crystalline grain growth in the entire completed portion. The particular direction may extend along a first path, and the film sample may be translated along a second path, the first axis being perpendicular to the first path. The second location can be provided at the distance from the first location approximately equal to the predetermined width.

According to another embodiment of the present invention, the film sample can be continuously scanned, at the constant predetermined speed, so that the successive impingement of the first and second beamlets of the irradiation beam pulses occurs in a further direction on the film sample between the second edge and the first edge, the further direction being opposite to the scanning direction. At that time, a plurality of fifth areas of the film sample can be successively irradiated with the second beamlets of the irradiation beam pulses so that the fifth areas are melted throughout their thickness and leaving additional unirradiated regions between respective adjacent ones of the fifth areas. Also, each one of the fifth areas irradiated by the second beamlets of each of the irradiation beam pulses can be allowed to re-solidify and crystalize. Furthermore, a plurality of sixth areas of the film sample can be successively irradiated by the first beamlets of the irradiation beam pulses so that the sixth areas are melted throughout their thickness, with each one of the sixth areas partially overlapping a respective pair of the re-solidified and crystalized fifth areas and the respective unirradiated region therebetween.

In still another embodiment, portions of the irradiation beam pulses can be masked to emit successive partial intensity irradiation pulse which have a reduced intensity so that when the successive partial intensity irradiation pulses irradiate a particular region of the film sample, the particular region is melted for less than the entire thickness of the film sample. Then, each of the re-solidified and crystalized second areas can be successively irradiated by the respective one of the successive partial intensity irradiation pulses.

In a further embodiment of the present invention, a method and system for processing a semiconductor thin film sample on a substrate is provided. The substrate has a surface portion that does not seed crystal growth in the semiconductor thin film. The film sample has a first edge and a second edge. An irradiation beam generator is controlled to emit successive irradiation beam pulses at a predetermined repetition rate. Each of the irradiation beam pulses is masked to define a first plurality of beamlets and a second plurality of beamlets, the first and second plurality of beamlets of each of the irradiation pulses being provided for impinging the film sample and having an intensity which is sufficient to melt irradiated portions of the film sample throughout their entire thickness. The film sample is continuously scanned, at a constant predetermined speed, so that a successive impingement of the first and second beamlets of the irradiation beam pulses occurs in a scanning direction on the film sample between the first edge and the second edge. During the continuous scanning of the film sample, a plurality of first areas of the film sample are successively irradiated using the first beamlets of the irradiation beam pulses so that the first areas are melted throughout their thickness and leaving unirradiated regions adjacent to the first areas. Each of the first areas has a first border with a first width, the border extending along a first line which is perpendicular to the scanning direction. Also during the continuous scanning, each one of the first areas irradiated using the first beamlets of each of the irradiation beam pulses is allowed to re-solidify and crystalize. Following the resolidification and crystallization of the first areas, a plurality of second areas of the film sample are successively irradiated using the second beamlets of the irradiation beam pulses so that the second areas are melted throughout their thickness. A first region of each one of the second areas completely overlaps at least one of the re-solidified and crystalized first areas, and a second region of the respective one of the second areas overlaps the respective unirradiated region provided adjacent to the re-solidified and crystalized first area. The first region has a second border with a second width which is greater than half of the first width, the second border extending along a second line which is parallel to and offset from the first line.

BRIEF DESCRIPTION OF THE DRAWINGS

Exemplary embodiments of the present invention will now be described in further detail with reference to the accompanying drawings in which:

FIG. 2 shows an enlarged view of an exemplary embodiment of the sample conceptually subdivided and having the silicon thin film thereon;

FIG. 3 shows an enlarged illustration of an intensity pattern of an irradiation beam pulse as defined by a first exemplary embodiment of a mask utilized by the system and method of the present invention which facilitates the single-scan, continuous motion SLS as it impinges the silicon thin film on a substrate;

FIG. 4 shows an exemplary irradiation path of beam pulses impinging the sample, as the sample is translated by the system of FIG. 1, using a first exemplary embodiment of the method according to the present invention which provides the single-scan, continuous motion SLS;

FIGS. 5A–5G show the radiation beam pulse intensity pattern and portions of grain structures on an exemplary first conceptual column of the sample having the silicon thin film thereon at various sequential stages of the SLS processing according to the first exemplary embodiment of the method of the present invention illustrated in FIG. 4, in which the intensity pattern of the irradiation beam pulse of FIG. 3 is used to irradiate a first conceptual column of the sample;

FIG. 12 shows an enlarged illustration a fourth exemplary embodiment of an intensity pattern of the irradiation beam pulse as defined by yet another mask utilized by the system and method of the present invention as it impinges the silicon thin film of the sample, which includes two lower-energy portions, each provided opposite to one another and adjacent to a respective different section of slit-shaped beamlets of the irradiation beam pulse;

FIGS. 13A–13D show the radiation beam pulse intensity pattern and the grain structure of a portion of an exemplary conceptual first column of the silicon thin film provided on the sample at various sequential stages of SLS processing according to a third exemplary embodiment of the method of the present invention, which uses the technique of the first embodiment of the method illustrated in FIGS. 5A–5G, after the sample is rotated 90° in a clock-wise direction;

DETAILED DESCRIPTION

Figure 1:
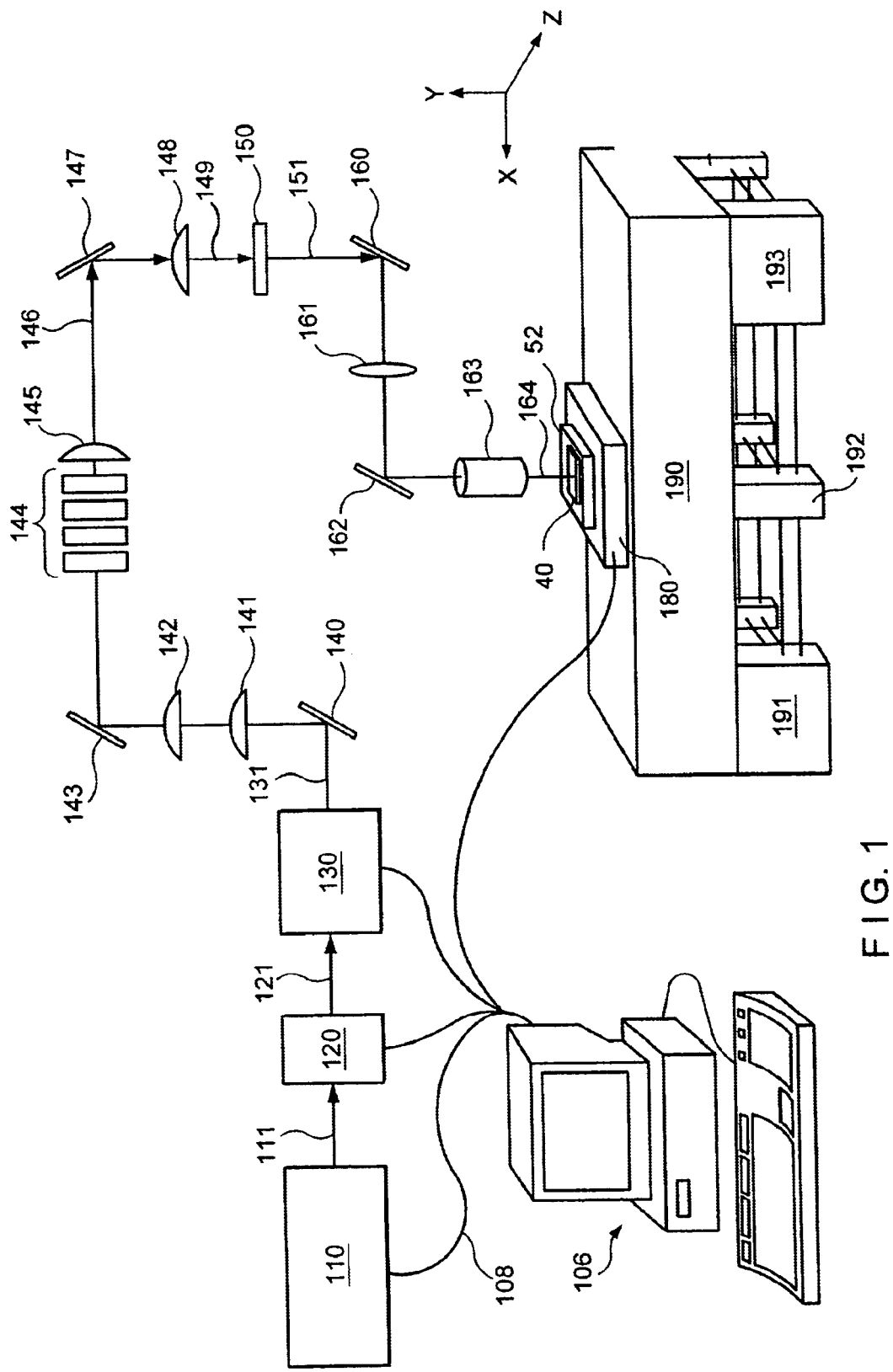
FIG. 1 shows a diagram of an exemplary embodiment of a system for performing a single-scan continuous motion sequential lateral solidification ("SLS") according to the present invention which does not require a microtranslation of a sample for an effective large grain growth in a silicon thin film.

Certain systems and methods for providing a continuous motion SLS are described in U.S. patent application Ser. No. 09/526,585 (the "'585 application"), the entire disclosure of which is incorporated herein by reference. The '585 application explicitly describes and illustrates the details of these systems and methods, and their utilization of microtranslations of a sample, which has an amorphous silicon thin film provided thereon being irradiated by irradiation beam pulses to promote the sequential lateral solidification on the thin film. Similar to the system described in the '585 application, an exemplary embodiment of a system for carrying out the continuous motion SLS processing of amorphous silicon thin films according to the present invention is illustrated in FIG. 1. The exemplary system includes a Lambda Physik model LPX-315I XeCl pulsed excimer laser 110 emitting an irradiation beam (e.g., a laser beam), a controllable beam energy density modulator 120 for modifying the energy density of the laser beam, a MicroLas two plate variable attenuator 130, beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), a 4×–6× eye piece 161, a controllable shutter 152, a multi-element objective lens 163 for focusing an incident radiation beam pulse 164 onto a sample 40 having a silicon thin film 52 to be SLS processed mounted on a sample translation stage 180, a granite block optical bench 190 supported on a vibration isolation and self-leveling system 191, 192, 193 and 194, and a computer 106 (e.g., a general purpose computer executing a program or a special-purpose computer) coupled to control the pulsed excimer laser 110, the beam energy density modulator 120, the variable attenuator 130, the shutter 152 and the sample translation stage 180.

The sample translation stage 180 is controlled by the computer 106 to effectuate translations of the sample 40 in the planar X-Y directions and the Z direction. In this manner, the computer 106 controls the relative position of the sample 40 with respect to the irradiation beam pulse 164. The repetition and the energy density of the irradiation beam pulse 164 are also controlled by the computer 106. It should be understood by those skilled in the art that instead of the pulsed excimer laser 110, the irradiation beam pulse can be generated by another known source of short energy pulses suitable for melting a semiconductor (or silicon) thin film 52 in the manner described herein below. Such known source can be a pulsed solid state laser, a chopped continuous wave laser, a pulsed electron beam and a pulsed ion beam, etc. with appropriate modifications to the radiation beam path from the source 110 to the sample 40. While the computer 106, in the exemplary embodiment of the system shown in FIG. 1, controls translations of the sample 40 for carrying out the single-scan, continuous motion SLS processing of the silicon thin film 52 according to the present invention, the computer 106 may also be adapted to control the translations of the mask 150 and/or the excimer laser 110 mounted in an appropriate mask/laser beam translation stage (not shown for the simplicity of the depiction) to shift the intensity pattern of the irradiation beam pulses 164, with respect to the silicon thin film 52, along a controlled beam path. Another possible way to shift the intensity pattern of the irradiation beam pulse is to have the computer 106 control a beam steering mirror. The exemplary system of FIG. 1 may be used to carry out the single-scan, continuous motion SLS processing of the silicon thin film 52 on the sample 40 in the manner described below in further detail.

As described in further detail in the '585 application, an amorphous silicon thin film sample is processed into a single or polycrystalline silicon thin film by generating a plurality of excimer laser pulses of a predetermined fluence, controllably modulating the fluence of the excimer laser pulses, homogenizing the intensity profile of the laser pulse plane, masking each homogenized laser pulses to define beamlets, irradiating the amorphous silicon thin film sample with the beamlets to effect melting of portions thereof that were irradiated by the beamlets, and controllably and continuously translating the sample with respect to the patterned beamlets. The output of the beamlets, as provided in the '585 application, is controllably modulated to thereby process the amorphous silicon thin film provided on the sample into a single or grain-shape, grain-boundary-location controlled polycrystalline silicon thin film by the continuous motion sequential translation of the sample relative to the beamlets, and the irradiation of the sample by the beamlets of masked irradiation pulses of varying fluence at corresponding sequential locations thereon. One of the advantageous improvements of system and method according to the present invention is that there is a significant saving of processing time to irradiate and promote the SLS on the silicon thin film of the sample by completing the irradiation of a section of the sample 40 without the requirement of any microtranslation of the sample to be performed (i.e., the microtranslations as described in the '585 application).

FIG. 2 shows an enlarged view of an exemplary embodiment of the sample 40 having the amorphous silicon thin film 52 thereon. This exemplary sample 40, as shown in FIG. 2, is sized 40 cm in the Y-direction by 30 cm in the X-direction. The sample 40 is conceptually subdivided into a number of columns (e.g., a first column 210, a second column 220, etc.). The location/size of each column is stored in a storage device of the computer 106, and utilized by the computer 106 for later controlling the translation of the sample 40. Each of the columns 210, 220, etc. is dimensioned, e.g., 2 cm in the X-direction by 40 cm in the Y-direction. Thus, if the sample 40 is sized 30 cm in the X-direction, the sample 40 may be conceptually subdivided into fifteen (15) columns. Within the constraints of the system discussed below, the sample 40 may be subdivided into columns having different dimensions (e.g., 1 cm by 40 cm columns, 3 cm by 40 cm columns, 4 cm by 40 cm columns, etc.). When the sample 40 is conceptually subdivided into columns, at least a small portion of each column extending for the entire length of the column should be overlapped by the neighboring column(s), i.e., an overlapped portion 230, so as to avoid a possibility of having any unirradiated areas of the silicon thin film 52. The overlapped portions 230 are preferably provided between all neighboring columns. For example, the overlapped area may have a width of 1 $\mu$m. It should be understood that other widths of the overlapped portions are possible, such as 2 $\mu$m, and are within the scope of the present invention.

FIG. 3 shows an enlarged illustration of a first exemplary embodiment of an intensity pattern 235 of the masked irradiation beam pulse 164 which is defined by the mask 150 as it impinges the silicon thin film 52 provided on the sample 40. The intensity pattern 235 is produced by placing the mask 150, which has a particular pattern of the transparent and opaque regions, in the path of the homogenized irradiation beam 149, and the resultant beamlets exiting the mask 150 are focused by the objective lens 163 to produce the masked irradiation beam pulse 164 having the desired intensity pattern 235. Using such intensity pattern 235, the system and method of the present invention can effectuate the single-scan, continuous motion SLS of the silicon thin film 52. The first exemplary intensity profile 235 shown in this drawing includes two beamlet sections 250, 260, with the slit-shaped beamlets in each section being separated from one another in a predetermined manner. The location of the slit-shaped beamlets 255 of the first section 250 are provided at an offset in the X-direction with respect to the location of the slit-shaped beamlets 265 of the second section 260. A detailed discussion of the exemplary intensity pattern 235 shown in FIG. 3 is provided below.

As described above, the intensity pattern 235 includes two sections, i.e., a first beamlet section 250 and a second beamlet section 260. The first beamlet section 250 has first slit-shaped beamlets 255, each having a width of approximately 3 $\mu$m in the X-direction and a length of approximately ½ mm in the Y-direction. The first slit-shaped beamlets 255 are equidistantly spaced from one another by first shadow regions 257 (i.e., the first slit-shaped beamlets 255 are spaced apart from one another by these first shadow regions 257). The first shadow regions 257 may have a width of, e.g., 1½ $\mu$m.

As shown in FIG. 3, the second beamlet section 260 is located substantially adjacent to the first beamlet section 250 in the Y-direction, and has second slit-shaped beamlets 265. The second beamlet section 260 includes second shadow regions 267 separating the second slit-shaped beamlets 265 from one another. The second slit-shaped beamlets 265 and the second shadow regions 267 are separated from the first slit-shaped beamlets 255 and the first shadow regions 257 by an intervening shadow region 240. The dimensions of the second slit-shaped beamlets 265 and the second shadow regions 267 are substantially similar to those of the first slit-shaped beamlets 255 and the first shadow regions 257, respectively. It is preferable for an edge 258 of each one of the first slit-shaped beamlets 255, which extends in the Y-direction, to coincide with a line M which extends into the area of a respective one second slit-shaped beamlet 265, and for the other edge 259 of each first slit-shaped beamlet 255 to coincide with a line N which extends into the area of the second slit-shaped beamlets 265 adjacent to the one of the second slit-shaped beamlets having the line M extending therethrough. The first beamlet section 250 is separated from the second beamlet section 260 by an intervening shadow region 240 having a width of 5 $\mu$m. It should be noted that the masked irradiation beam pulse 164 does not project any beam energy into the shadow regions 257, 267, 240, while providing the full laser pulse intensity of the beamlets onto the silicon thin film 52.

Therefore, the dimension of the intensity pattern 235 in the Y-direction should be approximately 1.005 mm after adding the length of the first slit-shaped beamlets 255 (½ mm) and those of the second slit-shaped beamlets 265 (½ mm), plus 5 μm to account for the intervening shadow region 240. The dimension of the intensity pattern 235 in the X-direction should be equal to the width of the conceptual columns 210, 220. Therefore, the approximate dimension of the exemplary intensity pattern 235 shown in FIG. 3 is 2 cm in the X-direction by approximately 1.005 mm in the Y-direction. In addition, the cross-section of the homogenized irradiation beam 149 should be at least large enough to cover the portion of the mask 150 that defines the intensity pattern 235. The array of beamlets 151 exiting the mask 150 and then focused by the objective lens 163 results in the masked irradiation beam pulse 164 having dimensions in the X-direction that substantially matches the width of each of the conceptual columns 210, 220 of the sample 40. It is preferable for the width the cross-sections of the masked irradiation beam pulse 164 (and thus of the intensity pattern 235) in the X-direction to be slightly greater than the width of each of the conceptual columns 210, 220. The advantages of such dimensions will be understood from the further description of the first embodiment of the method according to the present invention as discussed in greater detail below.

It should be understood that the width of the first and second slit-shaped beamlets 255, 265 may depend on a number of factors, e.g., the energy density of the incident laser pulse, the duration of the incident irradiation beam pulse, the thickness of the silicon thin film 52 provided on the sample 40, the temperature and thermal conductivity of the substrate, etc. While it is desirable from the standpoint of processing efficiency to utilize the slit-shaped beamlets 255, 265 which have a larger width in the X-direction so as to cover a greater width of the sample 40, it is important to select the width of the first and second slit-shaped beamlets 255, 265 such that when portions of the silicon thin film 52 provided on the sample 40 are irradiated thereby and are completely melted throughout their thickness, no nucleation occurs within such melted portions when they re-solidify and crystalize. In particular, if the width of the slit-shaped beamlets 255, 265 is too large, certain areas within the fully-melted portions may re-solidify before the controlled lateral grain growth reaches these areas. If this occurs, the control of the grain growth in the irradiated areas will be compromised.

Other dimension and shapes of the first slit-shaped beamlets 255, the first shadow regions 257, the second slit-shaped beamlets 265, the second shadow regions 267 and/or the shadow region 240 are contemplated, and are within the scope of the present invention. For example, if the extension or length of each of the first and second slit-shaped beamlets 255, 265 is approximately 1 mm (i.e., instead of ½ mm), the dimension of the intensity pattern 235 of the masked irradiation beam pulse 164 in the Y-direction would be 2 mm.

One of the important aspects of the intensity pattern 235 according to the present invention is that if the sample 40 is translated such that portions of the silicon thin film areas previously irradiated by the first beamlet section 250 (as well as re-solidified and crystalized) are irradiated by the second beamlet section 260, each of the slit-shaped second beamlets partially overlap a respective pair of regions previously irradiated by the first slit-shaped beamlets 255 of the first beamlet section 250, as well as overlapping the unirradiated region (i.e., the region overlapped by a respective shadow region 257) therebetween. This is because when the sample 40 is translated in the Y-direction by the sample translation stage 180, the second slit-shaped beamlets 265 of the masked irradiation beam pulse 164 should completely melt a portion of the silicon thin 52 film which was previously melted (by the first slit-shaped beamlets 255 of the masked irradiation beam pulse 164), cooled, re-solidified and crystallized. Such preferable technique according to the present invention promotes the lateral, controlled grain growth in the cooling regions of the silicon thin film 52 to extend such grain growth from the area that was completely melted by the first slit-shaped beamlets 255, cooled and re-solidified (and not later re-melted) into the area that was previously solidified and re-melted, and to further extend lateral crystal into the newly melted area (that is adjacent to the originally-melted area). The details of this technique and method according to the preferred embodiment of the present invention is described in further detail below.

For the exemplary sample 40 shown in FIG. 2 and described above, and for the purposes of the foregoing, the intensity pattern 235 of the masked irradiation beam pulse 164 may be defined as 2 cm in the X-direction by ½ cm in the Y-direction (e.g., a rectangular shape). However, as described above, the intensity pattern 235 of the masked irradiation beam pulse 164 is not limited to any particular shape or size. Indeed, other shapes and/or sizes of the intensity pattern 235 may be used, as would be apparent to those having ordinary skill in the art based on the teachings provided herein (e.g., square shape, circle, etc.). It should be understood that if a different the intensity pattern of the masked irradiation beam pulse 164 is desired, the mask 150, and possibly of the homogenized irradiation beam 149 would have to be modified to define the intensity pattern 235 after focusing by the objective lens 163.

The cross-section of the masked irradiated beam pulse 164 (i.e., the beam pulse area ($B_A$)) can be determined as follows:

$$B_A \approx \frac{E_{PULSE} \times K_{OPTICS}}{ED_{PROCESS}} \qquad (1)$$

where $E_{PULSE}$ is the energy per pulse of the laser or pulsed irradiation beam, $K_{OPTICS}$ is the fraction of the irradiation beam energy passing through the optics of the system, and $ED_{PROCESS}$ is the energy density of the process (e.g., 500 mJ/cm² for 500 Å silicon thin film and 30 nseconds pulse duration). It is preferably to determine $ED_{PROCESS}$ experimentally.

Figure 5A:
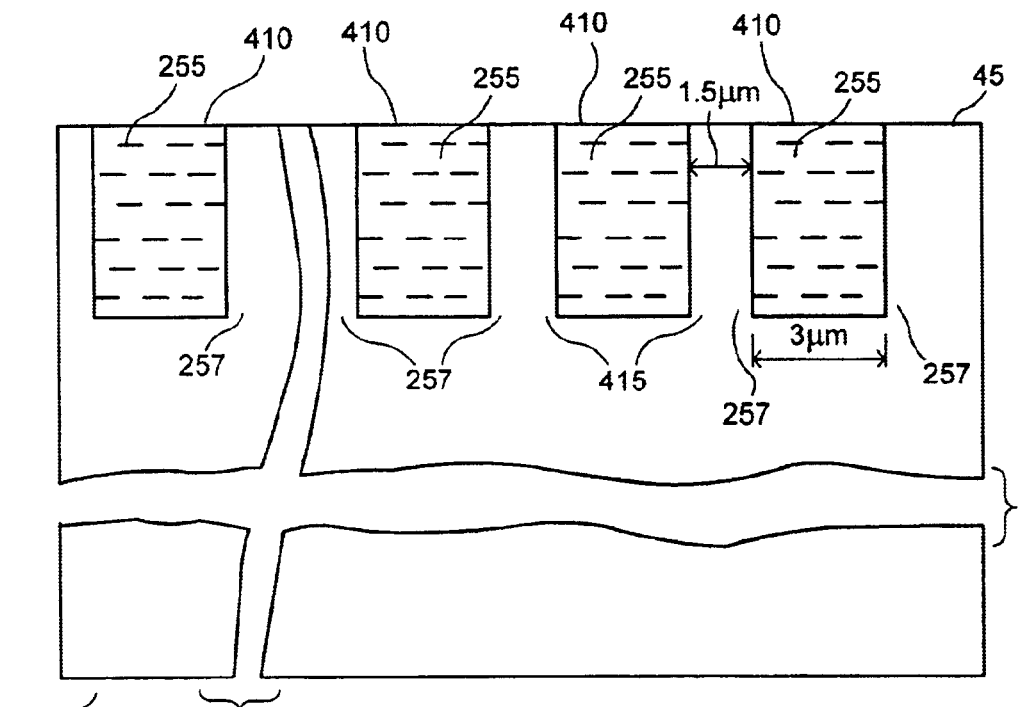
Figure 5B:
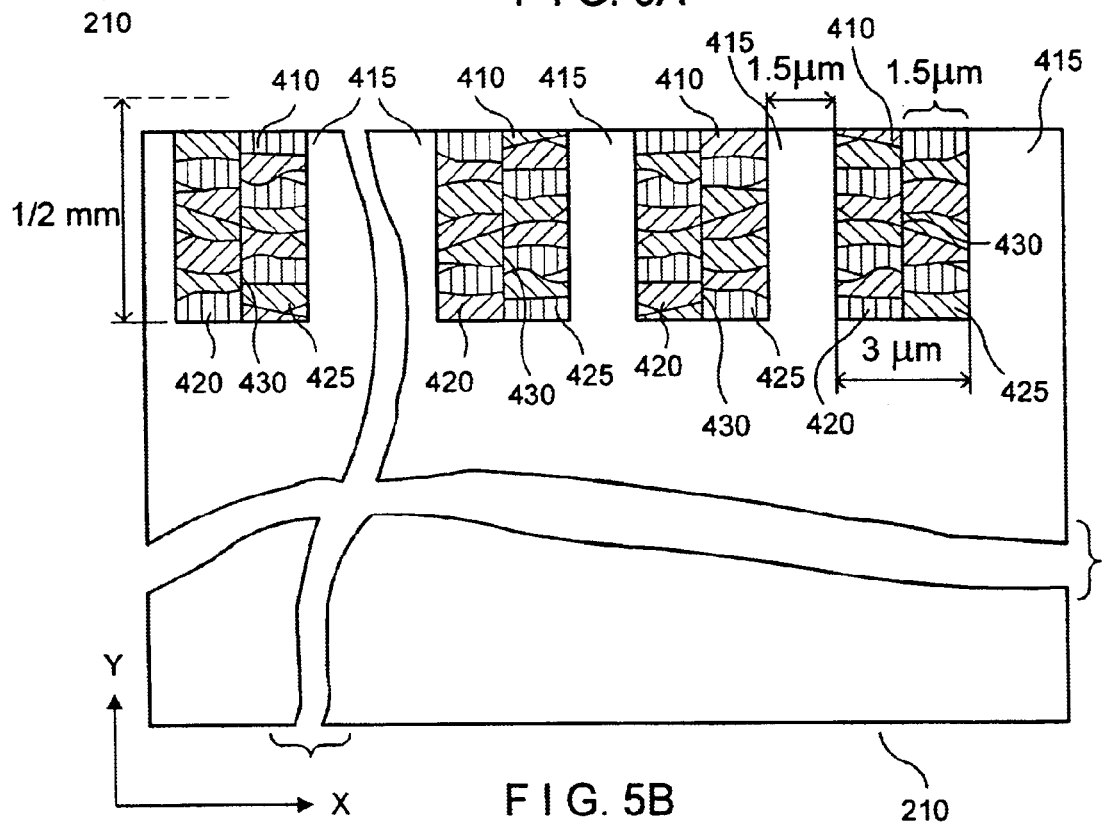
Figure 5C:
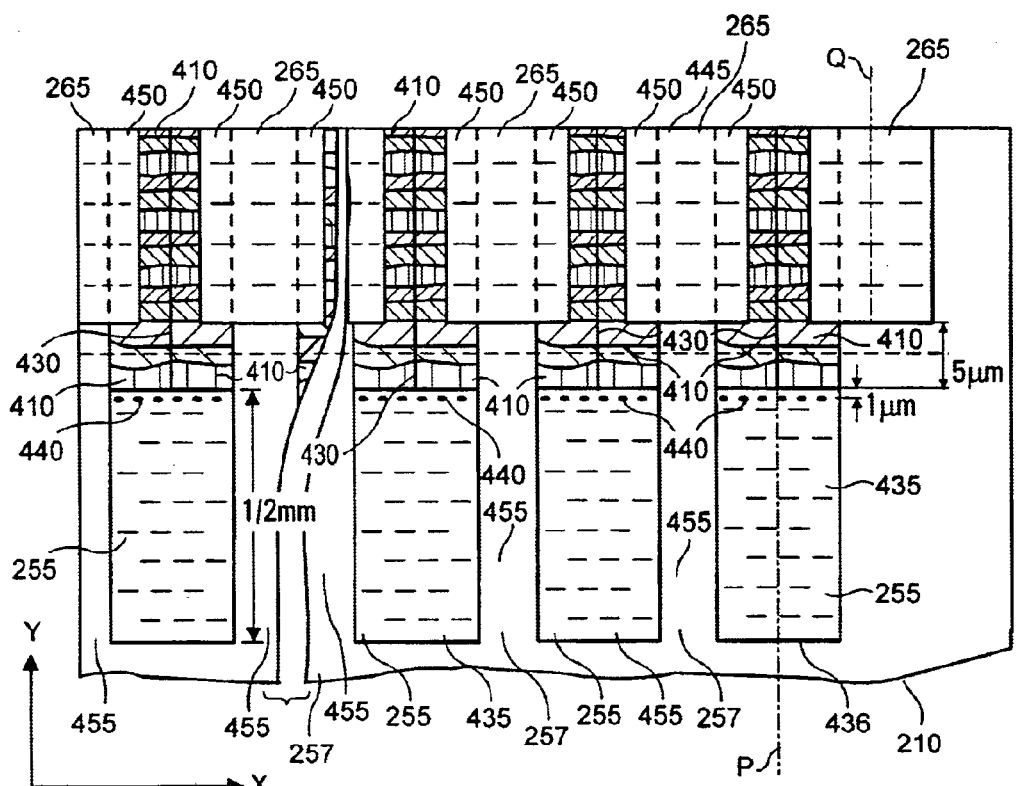
Figure 5D:
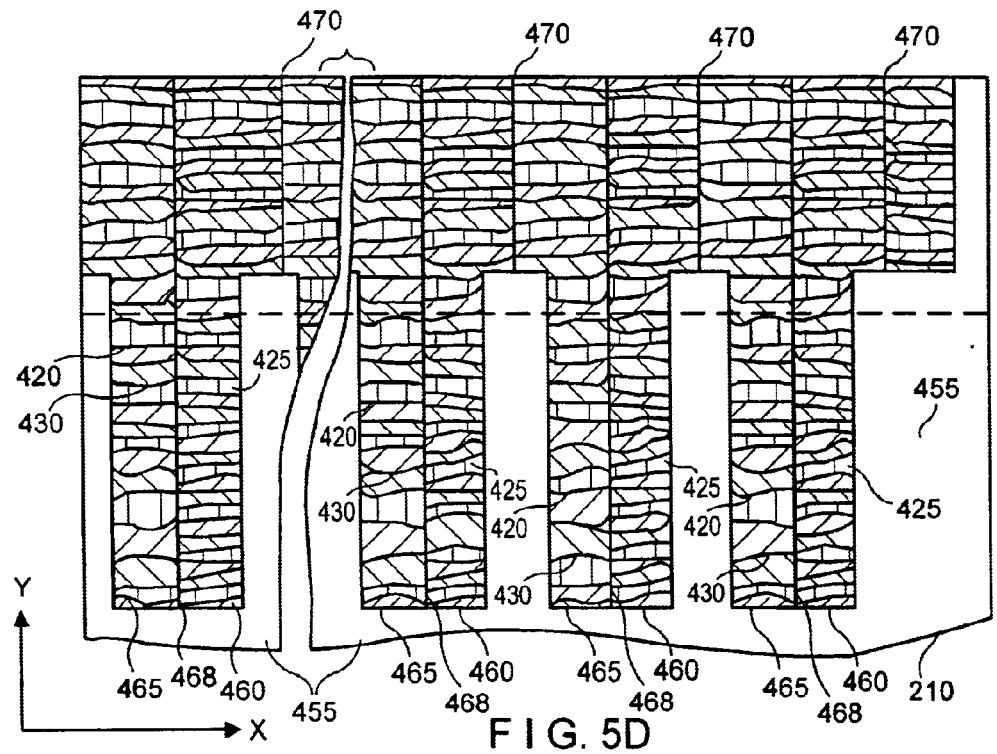
Figure 5F:
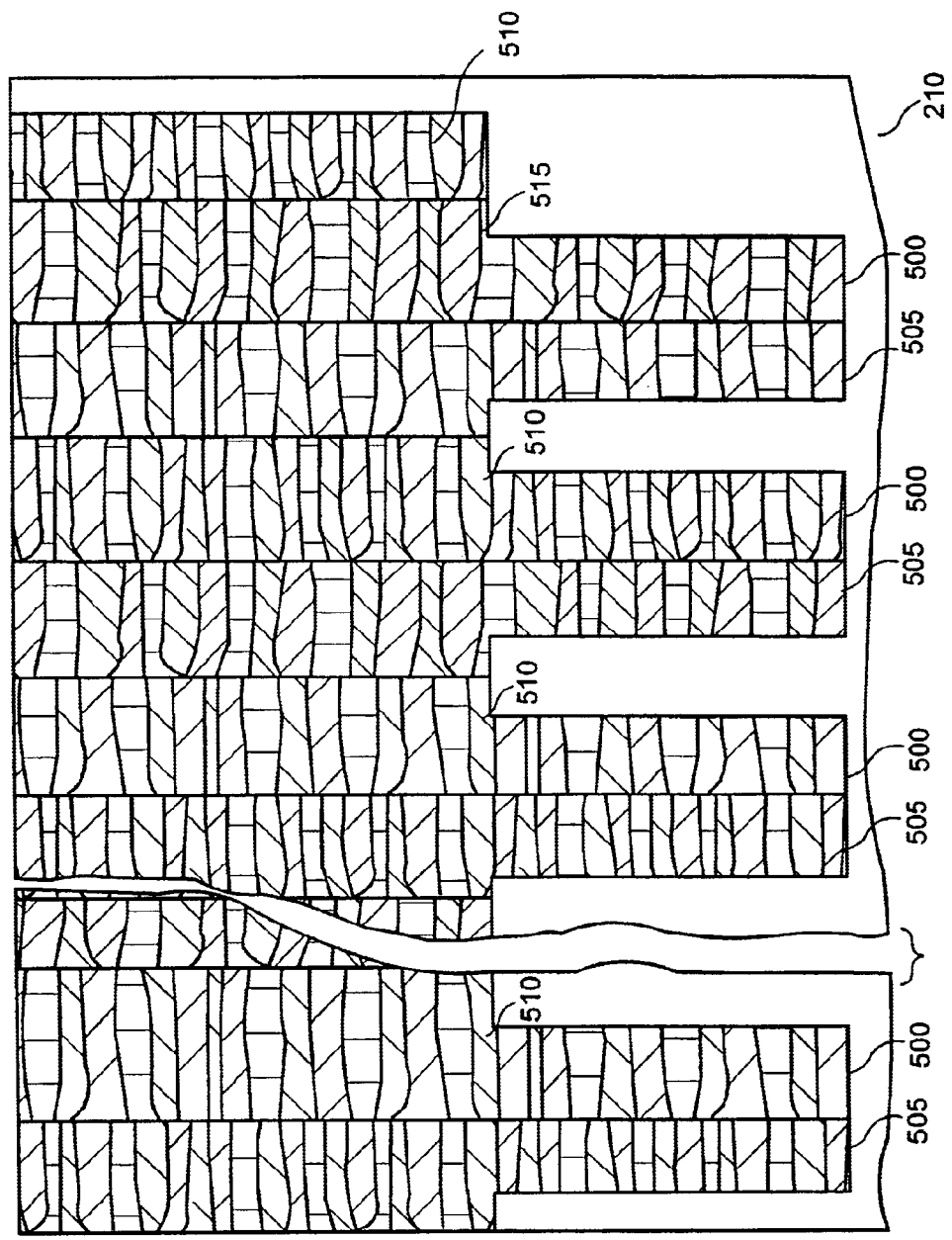
Figure 5G:
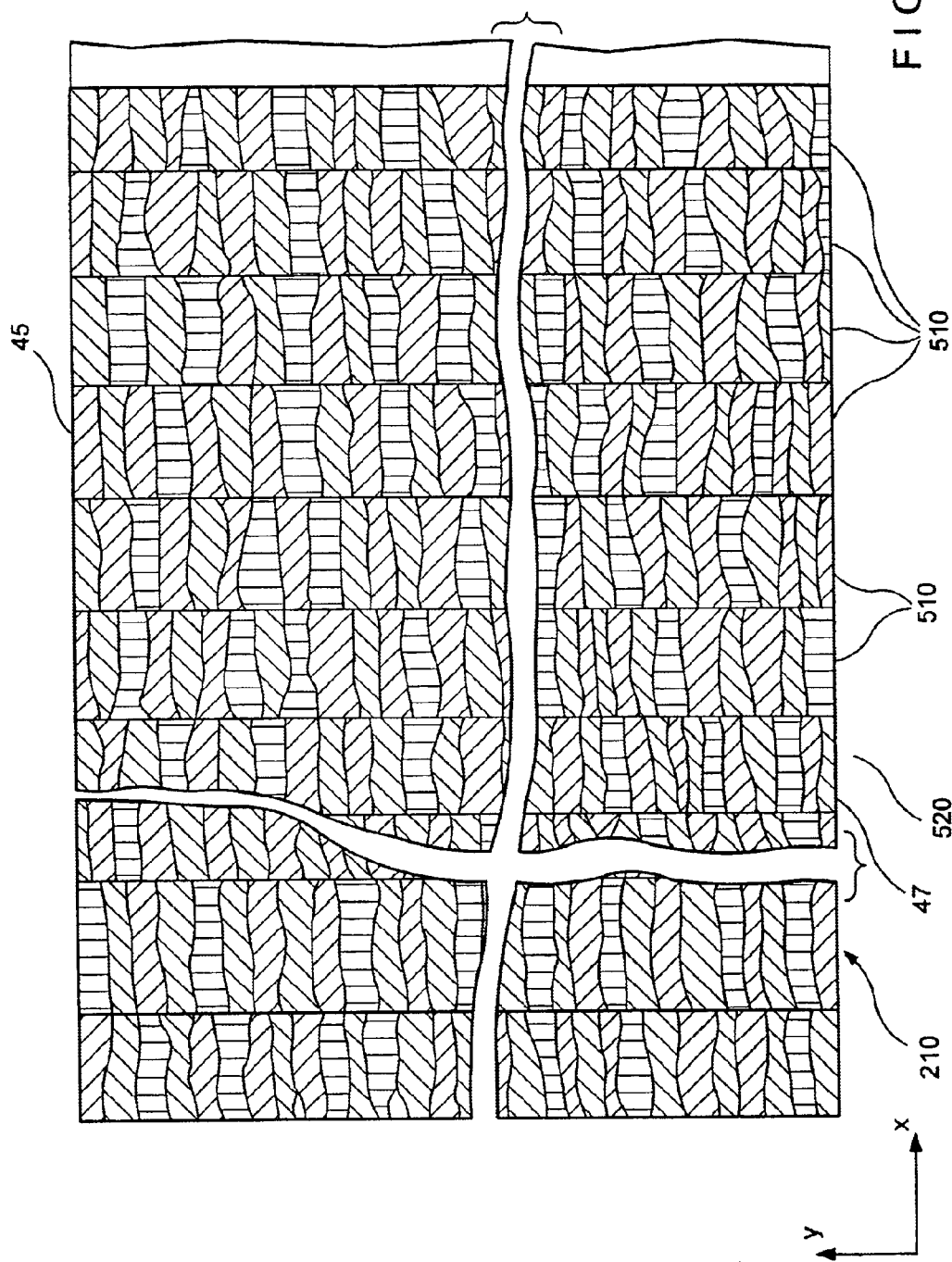
Figure 6A:
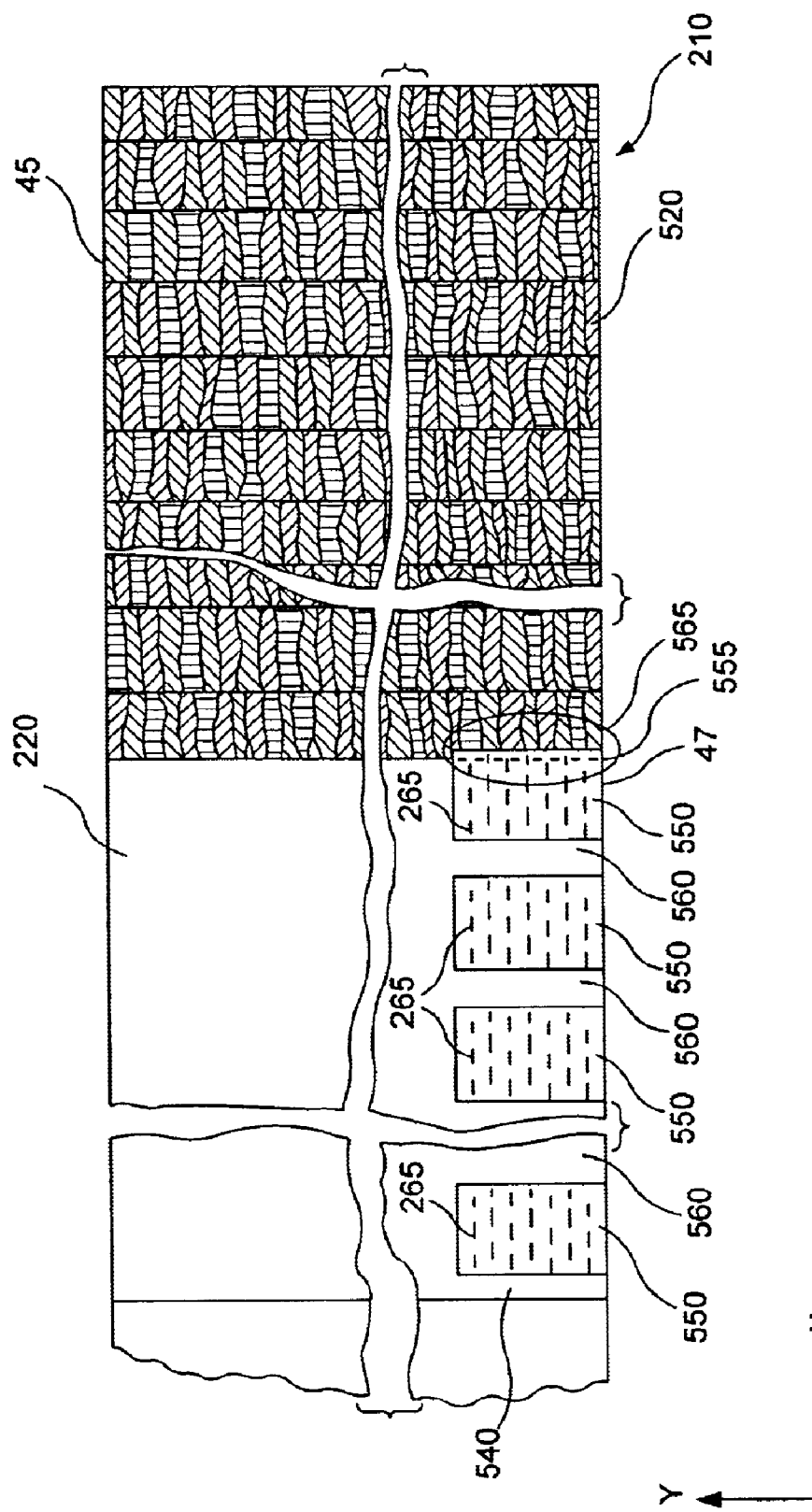
FIGS. 6A and 6B show the radiation beam pulse intensity pattern and portions of the grain structures on an exemplary second conceptual column of the sample having the silicon thin film thereon at two sequential stages of SLS processing according to the first exemplary embodiment of the method of the present invention illustrated in FIG. 4, which is performed along a second conceptual column of the sample, after the silicon thin film of the entire first conceptual column of the sample illustrated in FIGS. 5A–5G is completely melted, re-solidified and crystalized.
Figure 6B:
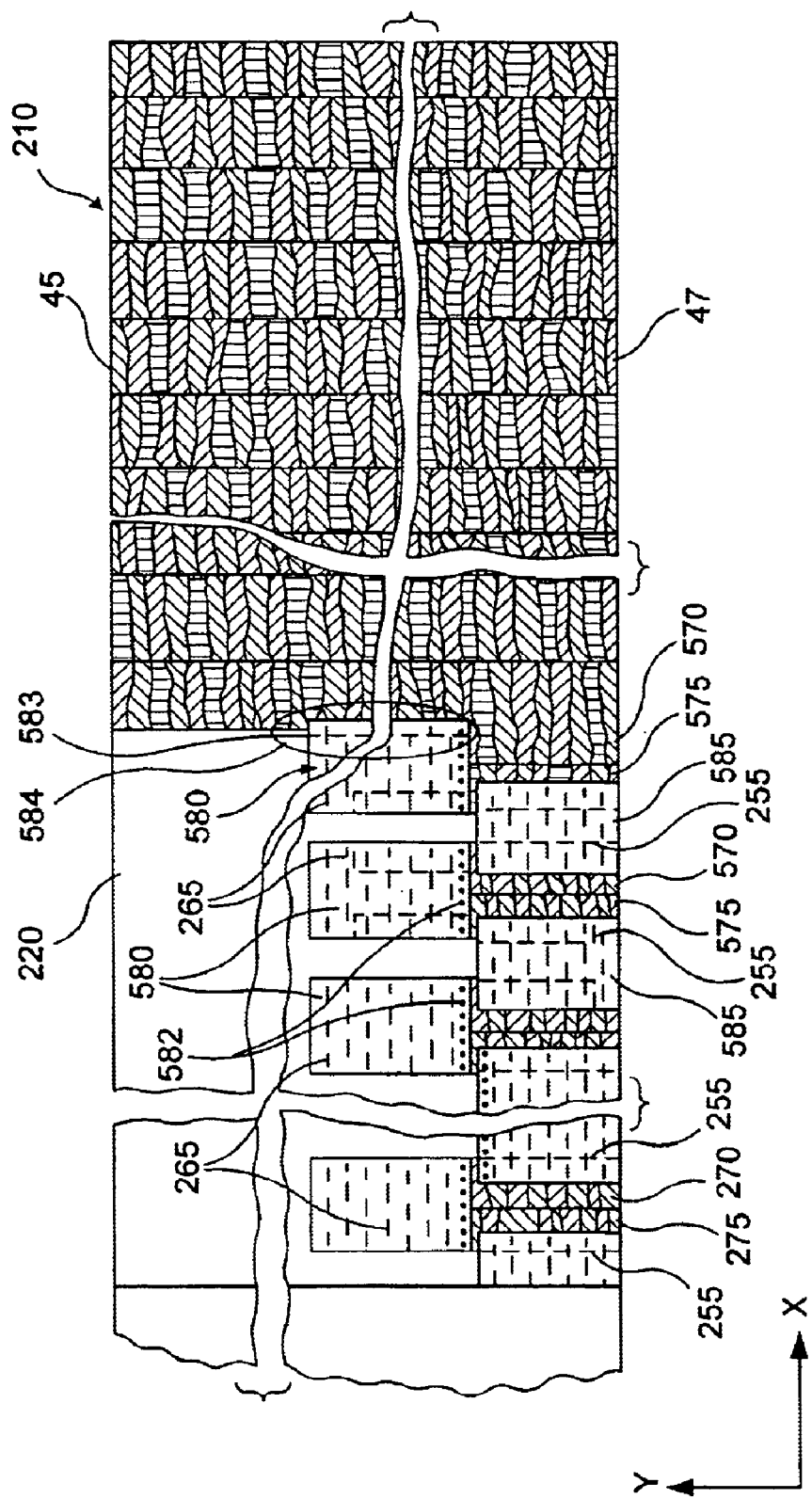

Referring now to FIGS. 4, 5A–5G and 6A–6B to describe the details of the first exemplary embodiment of the method according to the present invention, FIG. 4 shows an exemplary irradiation path of beam pulses impinging portions of the silicon thin film 52 provided on the sample 40 as the sample 40 is translated under the control of the computer 106 by the sample translation stage 180 of FIG. 1. In this drawing, a first exemplary embodiment of a method which effectuates the single-scan, continuous motion SLS according to the present invention, is utilized. FIGS. 5A–5G show the intensity pattern of the radiation beam pulse 164 and the grain structure on an exemplary first conceptual column 210 of a silicon thin film on the sample 40 at various sequential stages of continuous motion SLS processing according to the first exemplary embodiment of the method of the present invention, which is discussed below with reference to FIG. 4. In this part of the method, the masked radiation beam pulses 164 have an intensity pattern defined by the mask 150 to provide the intensity pattern 235 which is illustrated in FIG. 3. FIGS. 6A–6B show the masked radiation beam pulse intensity pattern and portions of the grain structures in an exemplary second conceptual column 220 of the sample 40 having the silicon thin film 52 thereon at two sequential stages of SLS processing according to the first exemplary embodiment of the method of the present invention illustrated in FIG. 4. This part of the method is performed after the silicon thin film 52 of the entire conceptual first column 210 of the sample 40 illustrated in FIGS. 5A–5G is completely melted, cooled, re-solidified and crystalized.

Turning first to FIG. 4, the sample 40 is placed on the sample translation stage 180, which is controlled by the computer 106. The sample 40 is placed such that the fixed position masked irradiation beam pulse 164 (having the intensity pattern 235 defined by the mask 150) impinges on a location 300 away from the sample 40. Thereafter, the sample 40 is translated in the Y-direction, and gains momentum to reach a predetermined velocity before the masked irradiation beam pulse 164 reaches and impinges an edge 45 of the sample 40 at a location 310. This is shown in FIG. 4 as a path 305 which illustrates the path of the masked irradiation beam pulse 164 as the sample 40 is translated in the Y-direction. By controlling the motion of the sample 40 in the X and Y directions, the computer 106 controls the relative position of the sample 40 with respect to the masked irradiation beam pulse 164 which irradiates the silicon thin film 52 provided on the sample 40. The pulse duration, the pulse repetition rate and the energy of each pulse of the masked irradiation beam pulse 164 are also controlled by the computer 106.

In the first embodiment of the present invention as illustrated in FIG. 4, the sample 40 is translated with respect to the stationary irradiation beam pulse 164 in order to sequentially irradiated successive portions of the silicon thin film 52 along predefined paths of irradiation to obtain a lateral growth of large grains having controlled grain size and shape, and controlled grain boundary location and orientation in the silicon thin film 52. In particular, as the sample 40 is translated in the Y-direction, the stationary irradiation beam pulse 164 impinges and melts successive portions of the entire first column 210 along a path 315, starting from the location 310 until the radiation beam pulse 164 reaches a bottom edge 47 (opposite and parallel to the edge 45) at a location 320. The masked irradiated beam pulses 164 are only limited to the intensity pattern 235 defined by the mask 150 so long as each beamlet of the intensity pattern 235 of each masked irradiation beam pulse 164 has sufficient energy to melt a region of the silicon thin film 52 which it irradiates throughout its entire thickness, and each melted region of the silicon thin film 52 is sufficiently dimensioned to allow the lateral growth of grains in the melted region without nucleation inside the melted regions.

To reiterate, the paths of the irradiation of the silicon thin film 52 are shown in FIG. 4 in the frame of reference of the translating sample 40 so that the stationary irradiation beam pulse 164 (shown in FIG. 1) is depicted as traversing the stationary sample 40.

As shown in FIG. 4, the computer 106 causes the radiation beam pulse 164 to be emitted and the sample 40 to be positioned such that the masked irradiated beam pulse 164 impinges a first location 300 in the frame of reference of the sample 40. The sample 40 is then accelerated in the +Y direction under the control of the computer 106 to reach a predetermined velocity with respect to the stationary irradiation beam pulse 164, which traces a first path 305 not on the sample 40. It is noted again that the path 305 is not the result of movement of the masked irradiated beam pulse 164, which is stationary, but represents the movement of the sample 40 relative to the stationary irradiation beam pulse 164.

When the upper edge 45 of the sample 40 reaches the position of impingement by the radiation beam pulse 164 at the location 310, the sample 40 is translating at the predetermined velocity with respect to the stationary irradiation beam pulse 164. The predetermined velocity V can be defined according to the following equation:

$$V = f \times \frac{w_B}{2} \quad (2)$$

where f is the frequency (pulse repetition rate) of the stationary irradiation beam pulse 164 and $W_B$ is the dimension of the masked irradiation beam pulse 164 in the Y-direction. As discussed above, the dimension of the masked irradiated beam pulse 164 in the Y-direction may be 2 cm. The frequency f of the stationary irradiation beam pulse 164 may have a repetition pulse rate between 100 hertz and 500 hertz (preferably 250 hertz). In this embodiment of the present invention, the predetermined velocity is, for example, 250 cm/sec. It is also possible to utilize other frequency ranges depending on the configuration and the type of the excimer laser 110 being used. Thereafter, the sample 40 is continuously translated in the +Y direction at the predetermined velocity while the masked irradiated beam pulses 164 irradiates successive portions of the silicon thin film 52 provided on the sample 40 at a predetermined pulsed repetition rate along a second irradiation path 315, which traverses the length of the sample 40 in the −Y direction.

FIGS. 5A–5G illustrate the sequential steps of the irradiation (i.e., by the radiation beam pulse 164) and the re-solidification of the first column 210 of the silicon thin film 52 provided on the sample 40 as the sample 40 is translated in the +Y direction so that the successive portion of the silicon thin film 52 in the first column 210 of the sample 40 are irradiated along the second irradiation path 315.

In particular, FIG. 5A shows the irradiation and complete melting of first areas 410 of the silicon thin film 52 in the first conceptual column 210 adjacent to the top edge 45 of the sample 40 where the sample 40 is overlapped only by the first beamlet section 250 of the intensity pattern 235 of the stationary radiation beam pulse 164, and the first slit-shaped beamlets 255 irradiates and completely melts the silicon thin film 52 in areas 410 of the sample. Regions 415 of the silicon thin film 52 on the sample 40 are not irradiated and melted as a result of being overlapped by the first shadow regions 257 of the intensity pattern 235 of the masked irradiated beam pulse 164.

As the sample 40 is translated past the location 310 (illustrated in FIG. 4), the masked irradiated beam pulse 164 provides emit the first slit-shaped beamlets 255 of the intensity profile 235 (or a first masked radiation beam pulse) and irradiates each of the first areas 410 of the silicon thin film 52 on the first conceptual column 21C. In this manner, the silicon thin film portions provided in the first areas 410 are melted throughout the entire thickness thereof. It should be noted that each of the regions 415 of the first column 210 of the sample 40, overlapped by a respective one of the first shadow regions 257 of the intensity profile 235 remains unmelted.

Turning now to FIG. 5B, before the irradiation by a second irradiation beam pulse, in accordance with the predetermined pulse repetition rate, each of the areas 410 of the silicon thin film 52 in the first conceptual column 210 of the sample 40 that were melted by the first radiation beam pulse cools, re-solidifies and crystalizes to form two columns of grains 420, 425 grown towards one another from the respective adjoining unmelted regions 415.

During re-solidification and crystallization of the melted first areas 410, the unmelted regions 415 bordering the melted first areas 410 seed the lateral growth of grains in respective adjoining melted first areas 410. The two columns 420, 425 abut one another along a respective one of a plurality of grain abutment boundaries 430 after the abutting grains have grown by a characteristic growth distance of approximately 1.5 $\mu$m. Both columns of grains 420, 425 in each one of the re-solidification first areas 410 have a respective central portion in which grain boundaries form large angles (e.g., approximately 90°) with respect to the irradiation path 315.

While the cooling, re-solidification and crystallization of the melted areas 410 is taking place, the sample 40 is being continuously translated with respect to the stationary irradiation beam pulse 164 along the irradiation path 315 in the Y-direction. This is because when another area of the silicon thin film 52 on the first column 210 is irradiated by the second radiation beam pulse, the second beamlets 265 of the intensity pattern 235 of the stationary irradiation beam pulse 164 impinges the respective portion of the silicon thin film 52 so as to only partially overlap the respective adjacent pairs of the re-solidified and crystalized areas 410 and the unirradiated regions therebetween. For example, the timing for the emission of the second radiation beam pulse is controlled such that the distance of the translation of the sample 40 is less than the length of the first slit-shaped beamlets 255 (e.g., ½ mm).

Turning to FIG. 5C, the silicon thin film 52 in the first conceptual column 210 of the sample 40 is irradiated using both the first and second beamlet sections 250, 260 of the intensity profile 235. When the sample 40 reaches the position on the first column 210 at which the first slit-shaped beamlets 255 of the intensity profile 235 would overlap certain portions of the re-solidified areas 410, the computer 106 controls the excimer laser 110 to generate another irradiation beam pulse through the mask 150 (i.e., the second radiation beam pulse) to irradiate particular areas of portions of the silicon thin film 52 in the first conceptual column 210. The computer 106 times the pulses and controls the translation of the sample 40 so that the second radiation beam pulse irradiates the appropriate areas of the silicon thin film 52 as discussed below.

As shown in FIG. 5C, the second radiation laser pulse is generated so that the first slit-shaped beamlets 255 irradiate and completely melt second areas 435 of the silicon thin film 52 in the first conceptual column 210, and the second slit-shaped beamlets 265 completely melt third areas 445 of the silicon thin film 52 in the first conceptual column 210. The second areas 435 preferably extend along the same scanning path in the first column 210 as the first areas 410 that are shown in FIG. 5B. However, the second areas 435 are provided at an offset, the distance of which is slightly less than then length of the first areas 410 (i.e., ½ mm) in the negative Y-direction. As shown in FIG. 5C, overlapped areas 440 are provided between the first areas 410 and the second areas 435 which are small sections of the first areas 410 that were re-solidified, but again completely melted by the first slit-shaped beamlets 255 of the intensity profile 255. The computer 106 controls the timing of the pulses and the translation of the sample 40 to allow for the existence of such overlapped areas 440 so as to avoid the possibility of having unirradiated areas on the silicon thin film 52. The width of the overlapped areas 440 can be, e.g., 1 $\mu$m. Other width of the overlapped areas 440 may also be used (e.g., 0.5 $\mu$m, 1.5 $\mu$m, 2 $\mu$m, etc.)

The third areas 445 preferably extend along a line Q (in the Y-direction) which is parallel to the centerline P, along which the first areas 410 and the second areas 435 extend, and offset therefrom by approximately 0.75 $\mu$m. In addition, the bottom edge 436 of each of the second areas 435 is offset with respect to the Y-direction by 505 $\mu$m from the bottom edge 446 of the respective third area 445. The top edge 437 of each of the second areas 435 is offset in the Y-direction by 5 $\mu$m from the bottom edge 446 of the respective third area 445. Because of such configuration of the second areas 435 and the third areas 445, the third areas 445 overlap certain portions 450 of the re-solidified first areas 410 melted by the first masked irradiation beam pulse. Therefore, the silicon thin film 52 in these portions 450, which were overlapped by the third areas 445, are again completely melted throughout its thickness along with the previously unmelted regions.

FIG. 5D shows the cooling, re-solidification, grain growth and crystallization of the completely melted silicon thin film 52 provided in the second and third areas 435, 445, the overlapped areas 440 and the portion 450, and the previous melted regions. With reference to the second areas 435, each of these areas 410 re-solidifies and crystalizes to form two columns of grains 460, 465 that are seeded and grown towards one another from the adjoining unmelted regions 455. The two columns 460, 465 abut one another along a respective one of a plurality of grain abutment boundaries 468 after the abutting grains have grown by a characteristic growth distance of approximately 1.5 $\mu$m. Both columns 460, 465 in each of the second re-solidification areas 435 have a respective central portion in which grain boundaries form large angles (e.g., approximately 90°) with respect to the second irradiation path 315.

In the melted third areas 445 that adjoin respective non-overlapped portions of the first areas 410, which have been previously irradiated and re-solidified, the grains in such non-overlapped portions of the first areas 410 seed grain growth in the adjoining region of the third areas 445 until grains growing in the opposite directions in the third areas 445 abut one another at a grain abutment boundaries 470. In this manner, the grains of the first areas 410 of grains 420, 425 of silicon thin film 52 in the first areas are extended into the third areas 445 so as to increase the lengths of the grains.

Similarly to the discussion above with reference to FIG. 5B, while re-solidification of the second and third melted areas 435, 445 is taking place, the sample 40 is being continuously translated with respect to the stationary irradiation beam pulse 164 along the second irradiation path 315. In particular, the sample 40 is translated so that another area of the silicon thin film 52 is irradiated by a third radiation beam pulse having the intensity pattern 235 shown in FIG. 3, and the sample 40 is translated so as to only partially overlap certain regions of the re-solidified second and third areas 435, 445 by the third irradiation beam pulse. The timing of the generation of the third irradiation beam pulse is controlled in the similar manner as the control of the generation of the second pulse described above.

Turning to FIG. 5E, the third radiation laser pulse is generated so that the first slit-shaped beamlets 255 irradiate and completely melt fourth areas 475 of the silicon thin film 52 in the first column 210, and the second slit-shaped beamlets 265 completely melt fifth areas 485 of the silicon thin film 52 in the first column 210. The fourth areas 475 preferably extend in the same direction as the first areas 410 which are illustrated in FIG. 5B. Similarly to the second areas 435 of FIG. 5C, the fourth areas 475 are provided at a distance from the second areas 435 in the negative Y-direction which is slightly less than the length of the second areas 435 (i.e., slightly less than ½ nm). Overlapped areas 490 provided between the second areas 435 and the fourth areas 475, and overlapped areas 495 provided between the third areas 445 and the fifth areas 485 are small sections of the first and second areas, respectively, which were re-solidified but again completely melted by the first and second slit-shaped beamlets 255, 265 of the further intensity profile 405 of the masked irradiated beam pulse 164, respectively. The computer 106 controls the timing of the pulses and the translation of the sample 40 to allow for the creation of such overlapped areas 490, 495 in order to avoid the possibility of having unirradiated areas on the silicon thin film 52. The width of the overlapped areas 490, 495 is similar to that of the overlapped areas 440.

The positional relationship between the fourth and fifth areas 475, 485 is substantially the same as the positional relationship between the second and third areas 435, 445, the details of which are described above. Due to such configuration, the fifth areas 485 overlap certain portions 497 of the third re-solidified areas 445. Therefore, the silicon thin film 52 in these portions 497 (which were overlapped by the fifth areas 485) is again completely melted.

FIG. 5F shows the re-solidification and grain growth in the previously completely melted fourth and fifth areas 475, 485 and the overlapped areas 490, 497. The description of the re-solidification and lateral growth provided above with reference to FIG. 5D is equally applicable herein. In particular, as the fourth areas 475 are re-solidified, and the controlled grain lateral growth occurs therein that is seeded from their edges, two columns of grain formations 500, 505 are formed, thus effectively extending the columns 460, 465, respectively. With respect to the fifth areas 485, two columns of grain formations 510, 515 are also formed in a similar manner. Thus, the controlled lateral grain growth of the silicon thin film 52 is further extended along the first column 210 to include the previously and completely melted silicon thin film 52 provided in the fourth and fifth areas 475, 485.

As the sample 40 is continuously translated and the first column 210 of the silicon thin film 52 is irradiated by the masked irradiated beam pulse 164 along the second path 315, further areas of the silicon thin film 52 on the first column 210 are melted consistent with the melting configuration of the areas 435, 445 and the areas 475, 485, and the controlled sequential lateral solidification and grain growth in all such further areas of the first column 210 is effectuated. Thus, all portions of the silicon thin film 52 in the entire first conceptual column 210 of the sample 40 between the top edge 45 and the bottom edge 47 of the sample 40 are subjected to the continuous motion SLS. Since all areas in the first column 210 have been irradiated and subjected to the SLS, there is no need to further re-irradiate any portion of the silicon thin film 52 provided therein. In particular, the end product of such continuous motion SLS for the first column 210 is illustrated in FIG. 5G, which shows that when the cooling and re-solidification of all melted areas 410, 435, 445, 475, 485, etc. is completed, a re-solidification region 520 is formed having contiguous columns 510 of relatively long grains, along with grain boundaries oriented generally along the X-direction. This is an improvement over the prior SLS methods which require microtranslations of the sample 40 to be performed while each respective column of such sample is irradiated using the radiation beam pulse. Such microtranslations require the continuous translation of the sample to be slowed to a stop, the sampled to be microtranslated, then to increase the speed of the translation of the sample via the sample translation stage to reach a predetermined velocity, and to continue with the translation of the sample while irradiating the particular column of the silicon thin film.

Turning back to FIG. 4, when the sample 40 is translated so that the fixed position of impingement of the masked irradiated beam pulse 164 reaches a bottom edge 47 of the sample 40 at a location 320 with respect to the position of the sample 40, the translation of the sample 40 is slowed along a third path 325 until the sample 40 comes to a full stop when the fixed position of impingement of the radiation beam pulse 164 is at a location 330 with respect to the position of the sample 40. In the present embodiment, the predetermined pulse repetition rate is, for example, 250–300 pulses/sec (which is preferable for the excimer laser 110 used herein) and each pulse provides a beamlet intensity of approximately 500 mJ/cm$^2$ with a pulse duration of approximately 30 nseconds.

After the stationary irradiation beam pulse 164 in the frame of reference of the translating sample 40 has come to a stop at the location 330, the sample 40 translated in the X direction under the control of the computer 106 so that the pulsed irradiation beam pulse 164 traces a fourth path 335 until the masked irradiation beam pulse 164 impinges the sample 40 at a location 340. The sample 40 is then accelerated in the −Y direction so that the pulsed irradiation beam traverses a fifth path 345 such that the sample 40 reaches the predetermined velocity of translation by the time the bottom edge 47 of the sample 40 reaches a position 347 of impingement of the masked irradiated beam pulse 164. Thereafter, the sample 40 is continuously translated at the predetermined velocity in the −Y direction for the entire length of a sixth irradiation path 350, while the masked irradiation beam pulse 164 sequentially irradiates the metal layer 52 on second column 220 of the sample 40 at the predetermined pulsed repetition rate.

Referring to FIG. 6A, there is shown a portion 540 of the silicon thin film 52 in the second conceptual column 220 immediately above the lower edge 47 of the sample 40, after the translation of the sample 40, so that it is impinged by the masked irradiated beam pulse 164 along the sixth path 250. The portion 540 of the silicon thin film 52 in the second column 220 is first irradiated using the second slit-shaped beamlets 265, and areas 550 of the portion 540 are completely melted throughout their entire thickness. This is because the portion of the intensity profile of the masked irradiated beam pulse 164 which irradiates and completely melts the areas 550 using the second beamlet section 260 having the second slit-shaped beamlets 265 provided in the configuration that was described above. At this point in the process, the first slit-shaped beamlets 255 do not irradiate the second column 220 of the sample 40 because they are irradiated outside the boundaries of the sample 40 (i.e., below the bottom edge 47). It should be noted that a small strip 550 of a particular area 550, which is adjacent to the re-solidification region 520 of the first conceptual column 210, slightly overlaps a small portion 555 of the re-solidification region 520 along the length of such area 550 (e.g., for ½ mm). Prior to the irradiation by the second slit-shaped beamlets 265, when the masked irradiated beam pulse 164 impinges the sample 40 along the sixth path 350, this small portion 555 is subjected to the irradiation and SLS in the first column 210 of the sample. The small portion 555 corresponds to a initial section of the overlapping portion 230 shown in FIG. 4. The irradiated and melted silicon thin film 52 of the areas 550 are separated by the shadow areas 560. As described above, the reason that these areas 560 were not irradiated is because the first shadow regions 267 of the intensity pattern 235 of the masked irradiated beam pulse 164 did not irradiate and melt the areas 560.

The silicon thin film 52 provided in the areas 550 cool and re-solidify to effect lateral grain growth therein starting from their respective edges. In particular, each area 550 has two abutting columns of grains 570, 575 (shown in FIG. 6B) which extend along the entire length of the respective area 550. As described above with respect to the SLS of the first column 210, the grain growth is initiated from and seeded from the shadow areas 560 toward a center of the respective areas 550. With respect to the particular area 550 which has the small overlapping area 555, the grains of neighboring completed portion 565 seed and laterally grow into that particular area 550.

Turning to FIG. 6B as the areas 550 cool and re-solidify, the sample 40 is continuously translated in the negative Y-direction at the predetermined velocity along the sixth path 350, and another portion of the silicon thin film 52 in the second conceptual column 220 is irradiated. Since the masked irradiated beam pulse 164 impinges the silicon thin film 52 along the sixth path 350 while the sample 40 is translated by the computer 106 as described above, the second slit-shaped beamlets 265 irradiate and completely melt the silicon thin film 52 in areas 580. As discussed above with reference to FIGS. 5C and 6A, each of the areas 580 has a small area 582 which overlaps a portion of the previously irradiated and re-solidified respective area 550. In addition and as described above with reference to FIG. 6A, the particular area 580 bordering the re-solidification region 520 has a small area 583 which overlaps and melts a portion 584 thereof. In addition, the first slit-shaped beamlet 255 irradiate and completely melt the silicon thin film 52 in the areas 585. A small area 583 corresponds to a portion of the overlapping portion 230 shown in FIG. 4 which is subsequent to the small area 555 illustrated in FIG. 6A.

As further shown in FIG. 6B, the areas 585 are provided at a distance from the areas 580 (in the negative Y-direction) slightly greater than the entire length of the areas 580. The configuration of the areas 580, 585 with respect to one another is substantially similar to the configuration of the areas 435, 445 described above and shown in FIG. 5C. Thereafter, the areas 580, 585 cool and re-solidify in a substantially the same manner described above with reference to in FIG. 5C, only that the SLS for the silicon thin film 52 provided in the second column 220 of the sample 40 if effectuated from the bottom edge 47 of the sample 40, instead of from the top edge 45 as provided for the first column 210.

Again turning back to FIG. 4, when the sample 40 is translated in the −Y direction so that the fixed position of impingement of the masked irradiated beam pulse 164 reaches the top edge 45 of the sample 40, the translation of the sample 40 is slowed along a seventh path 355 until the sample 40 comes to a fill stop when the fixed position of impingement of the radiation beam pulse 164 on the sample 40 is at a location 360 with respect to the sample 40. After the stationary irradiation beam pulse 164 in the frame of reference of the translating sample 40 has come to a stop at the fourth location 360 (i.e., the translation of the sample 40 is stopped), the sample 40 is translated in the negative X-direction under the control of the computer 106 so that the masked irradiated beam pulse 164 traces an eighth path 365 until the masked irradiated beam pulse 164 impinges a location 370 outside the boundaries of the sample 40. The sample 40 is then accelerated in the Y-direction so that the masked irradiated beam pulse 164 traverses another path which is substantially parallel to the second irradiation path 315 (i.e., the sample 40 is again translated in the Y-direction). This procedure continues until the silicon thin film 52 provided in all conceptual columns of the sample 40 are irradiated, and the SLS is successfully effectuated therein.

Figure 7:
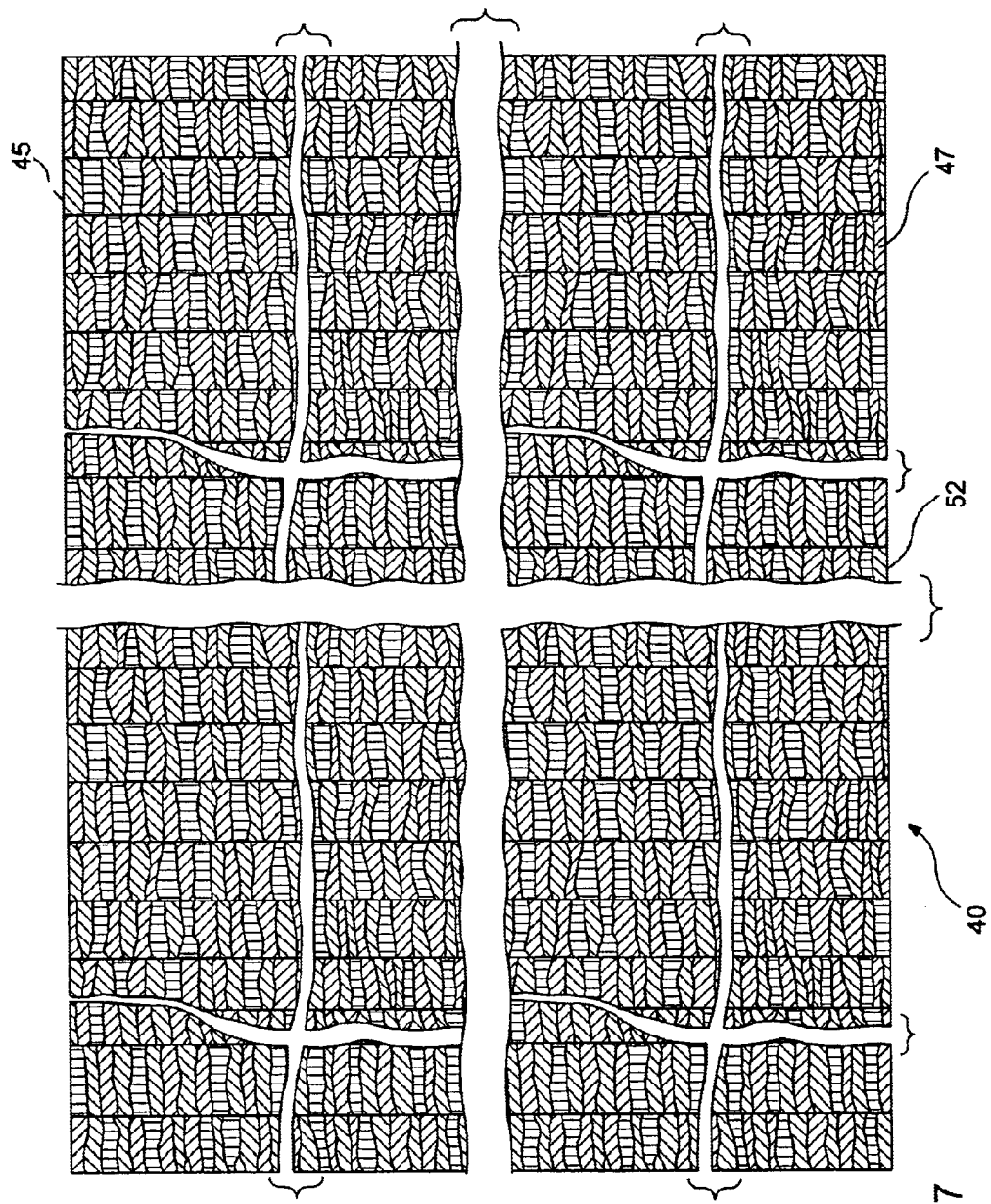
FIG. 7 shows an illustrative diagram of the crystallized silicon film of the sample after the silicon thin film in all conceptual columns of the sample is completely melted, re-solidified and crystalized.

As described above, each such translation of the sample 40 and the irradiation thereof is performed for every conceptual column of the sample 40. Thus, if the sample 40 is conceptually subdivided into 15 columns, the sample 40 is continuously translated in the Y-direction or the negative Y-direction 15 times. The results of the single step, continuous motion SLS according to the present invention is shown in FIG. 7. This drawing illustrates the end product of the sample 40 whose every area of the silicon thin film 52 extending along the entire periphery of the sample 40 is irradiated to promote the controlled SLS and grain growth thereon.

It is preferable to use a high aspect homogenized irradiation beam, i.e., having a wide and thin intensity profile in the direction of the translation of the sample 40. In particular, when such intensity is utilized, it takes less steps to irradiate all columns of the sample 40. There are also timing advantages to the utilization of the above-described embodiment of the method according to the present invention. Generally, the total process time $T_{PROCESS}$ to irradiate and process the silicon thin film 52 provided on the entire sample 40 is calculated as follows:

$$T_{PROCESS} = T_{CRYSTALIZATION} + T_{WASTED} \tag{3}$$

where:

$$T_{CRYSTALIZATION} = \frac{\frac{A_{TOTAL}}{A_{BEAM}} \times n}{f_{LASER}}, \tag{4}$$

$A_{TOTAL}$ is the total area of the sample 40 (e.g., 40 cm×30 cm=1200 cm²), $A_{BEAM}$ is a beam area (e.g., 2 cm×1 mm=20 mm²), and n is a number of shots fired at a particular point (e.g., for a two shot process illustrated in FIGS. 5A–5G and 6A–6B, n=2). In the present embodiment, the crystallization time for each column is approximately 1 second. Therefore, the total time of crystallization for the sample having 15 columns is 15 second. Next, the wasted time should be evaluated. For example, $$T_{WASTED} = n_{STEP} \times T_{STEP}, \tag{5}$$

where $n_{STEP}$ is the number of times the sample is stepped to the next column (e.g., for 15 columns, the sample is stepped 14 times), and $T_{STEP}$ is the time required for each such stepping (e.g., 0.3 seconds). Thus, $T_{WASTED}$ is 14×0.3 seconds=4.2 seconds for the sample 40. To compare this result with the time wasted for the method and system described in the '585 application, while the crystallization time of each column of the sample 40 is the same for the system and method of the present invention and that of the '585 application (due to a reduction of the sample velocity in the present invention by half as compared to the velocity of the sample described in the '585 application), the wasted time of the system and method of the '585 application is higher than that of the system and method of the present invention. This is because the system and method of the present invention does not require the sample 40 to be microtranslated (as described in the '585 application) when the masked irradiated beam pulse 164 is impinging a location outside of the periphery of the sample 40. Therefore, according to the present invention, the microtranslation time is not at issue because the sample 40 is not microtranslated. Thus, if the sample of '585 application is subjected to one microtranslation per column thereof, the time wasted not crystalizing the silicon thin film on the sample is 14 columns×0.3 seconds=4.2 second for microtranslations and 4.2 seconds for regular translations of the entire sample. Thus, the time savings to crystalize each sample using the system and method of the present invention is reduced by, e.g., 4.2 seconds as compared to the system and method of the '585 application.

Figure 8:
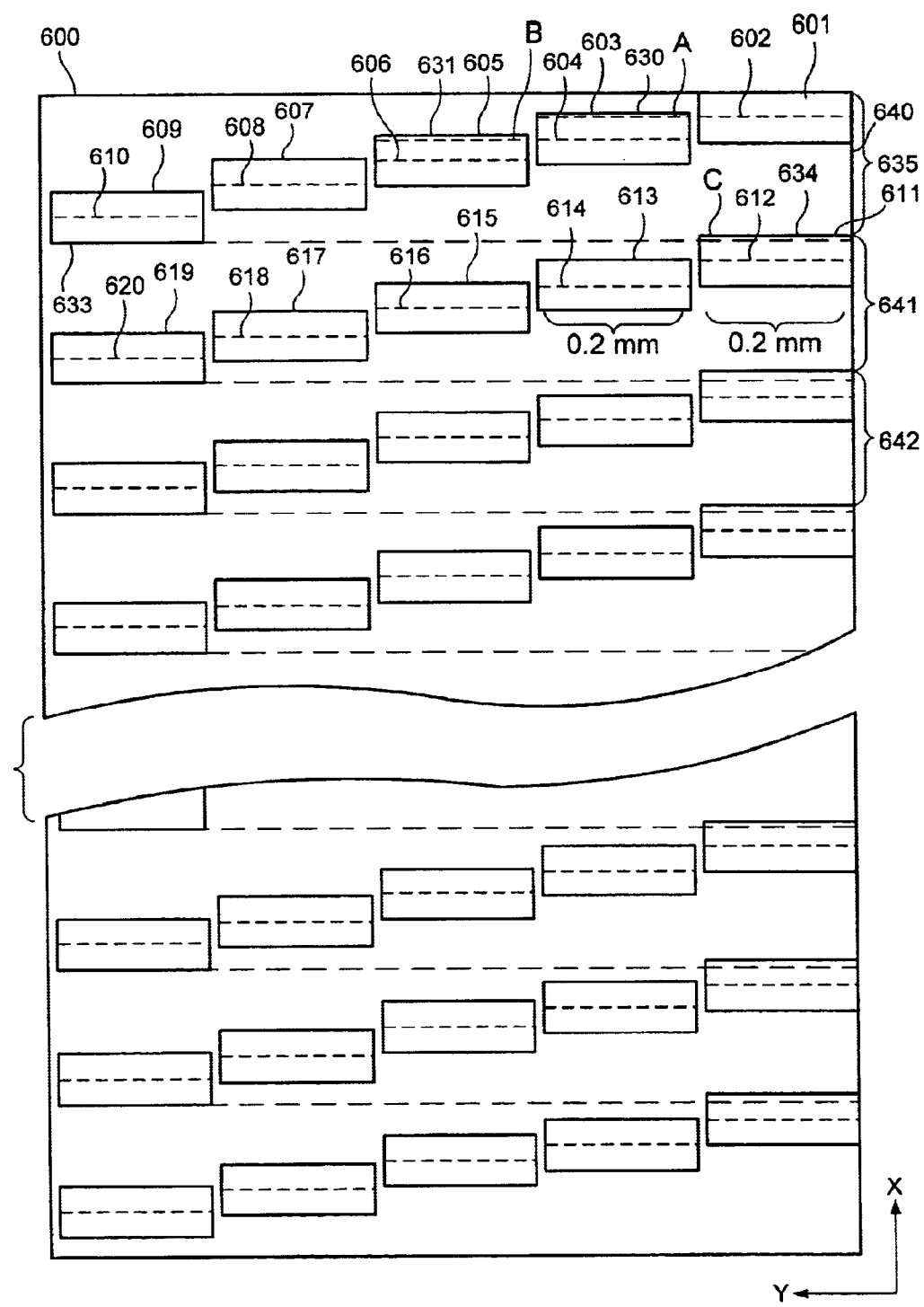
FIG. 8 shows an enlarged illustration of a second exemplary embodiment of an intensity pattern of the irradiation beam pulse as defined by a further mask utilized by the system and method of the present invention as it impinges the silicon thin film on the substrate, which promotes a growth of larger grains in the silicon thin film.

FIG. 8 shows an enlarged illustration of a second exemplary embodiment of an intensity pattern of the irradiated beam pulse as defined by a further mask 150 utilized by the system and method of the present invention as it impinges the silicon thin film on the substrate, which promotes a larger grain growth on the silicon thin film. This exemplary intensity pattern 600 includes slit-shaped beamlets 601, 603, 605, 607, 609, 611, 613, 615, 617, 619, etc. provided in a stepped manner. The width of the slit-shaped beamlets 601, 603, 605, 607, 609, 611, 613, 615, 617, 619 along the X-direction can be the same as that of the first slit-shaped beamlets 255 of the intensity pattern 235 (e.g., 3 μm), and the length of these slit-shaped beamlets can be, e.g., 0.2 μm. Other sizes and shapes of the slit-shaped beamlets 601, 603, 605, 607, 609, 611, 613, 615, 617, 619, etc. are conceivable, and are within the scope of the present invention.

In particular, the slit-shaped beamlet 601 is provided in a top-rightmost corner of the intensity pattern 600 The slit-shaped beamlet 603 is provided at an offset, in the −X direction, from the slit-shaped beamlet 601. In particular, a top edge 630 of the slit-shaped beamlet 603 extends slightly above a line A on which the center 602 of the slit-shaped beamlet 601 extends. Similarly, the slit-shaped beamlet 605 is provided at an offset (in the −X direction) from the slit-shaped beamlet 603 so that a top edge 631 of the slit-shaped beamlet 605 extends slightly above a line B on which the center 604 of the slit-shaped beamlet 603 extends. The same applies for the position of the slit-shaped beamlet 607 with respect to the slit-shaped beamlet 605, and the slit-shaped beamlet 609 with respect to slit-shaped beamlet 607. The slit-shaped beamlets 611, 613, 615, 617 and 619 are arranged in a substantially the same configuration as the slit-shaped beamlet 601, 603, 605, 607, 609, except that while the starting location of the slit-shaped beamlet 611 is the same as of the slit-shaped beamlet 601 along the Y-direction, the slit-shaped beamlet 611 is offset along the X-direction by a particular length 635. According to an exemplary embodiment of the present invention, the top edge 634 of the slit-shaped beamlet 611 is provided slightly above a line C on which the bottom edge 633 of the slit-shaped beamlet 609 extends. The configuration of the intensity pattern 600 is provided such that the first row 640 of the intensity pattern 600 (consisting of the slit-shaped beamlets 601, 603, 605, 607, 609) is provided above the second row 641 of the intensity pattern 600 (consisting of the slit-shaped beamlets 611, 613, 615, 617, 619) along the −X direction, followed by the third row 642, etc. The intensity pattern 600 can include a large number of rows of slit-shaped beamlets, e.g., 100, 1000, etc., depending on the width of the irradiation laser beam 149 impacting the mask 150, and the configuration of the slits and opaque regions of the mask 150.

Figure 9:
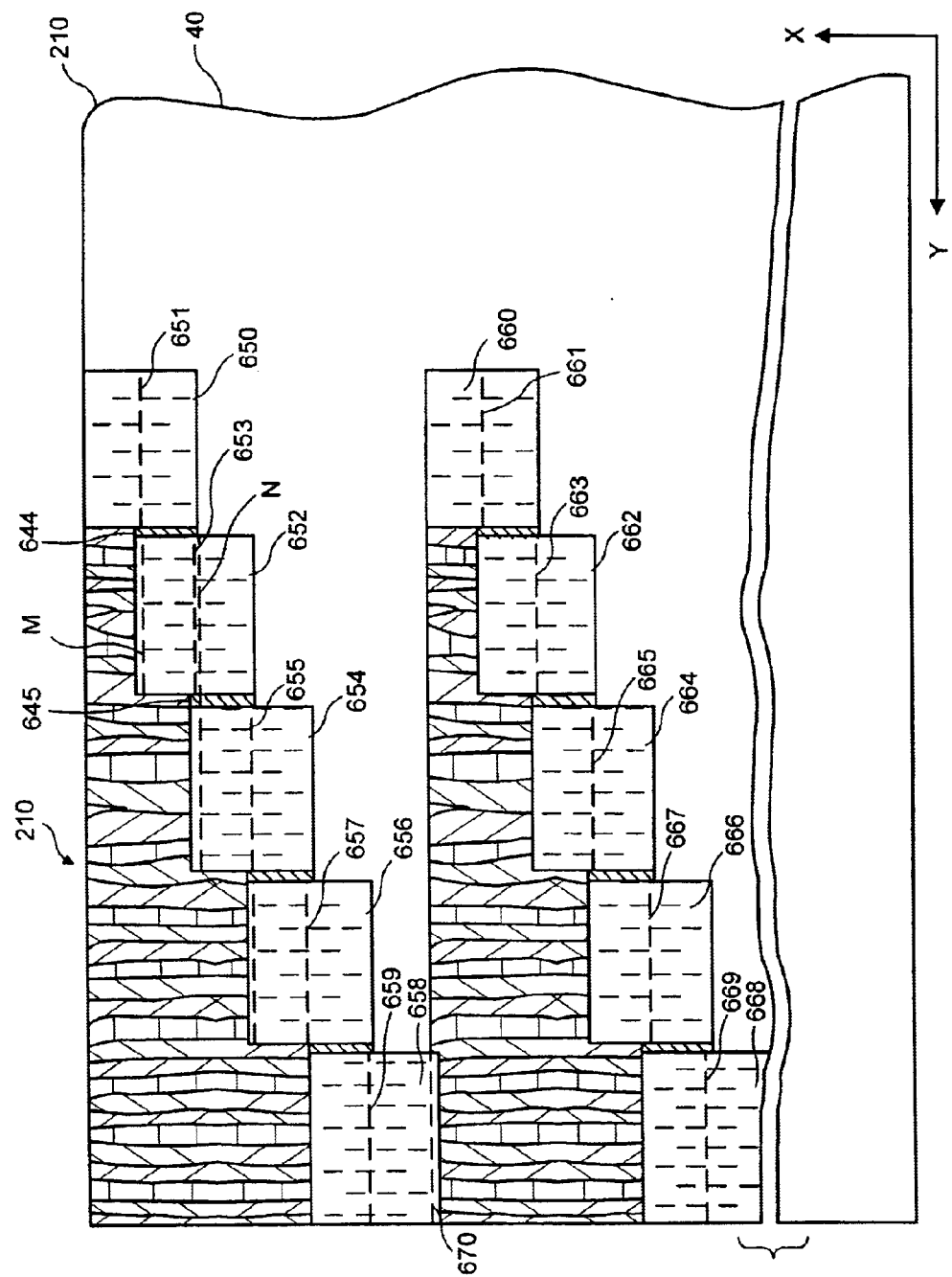
FIG. 9 shows the radiation beam pulse intensity pattern and the grain structure of a portion of an exemplary first conceptual column of the sample having the silicon thin film thereon at an exemplary stage of the SLS processing according to a second exemplary embodiment of the method of the present invention which utilizes the mask illustrated in FIG. 8 for growing longer grains in the silicon thin film.

FIG. 9 shows the grain structure of a portion of an exemplary first conceptual column 210 of the sample 40 having the silicon thin film 52 therein, as the intensity pattern 600 of the masked irradiated beam pulse 164 of FIG. 8 impinges the respective portions of the silicon thin film 52, at an exemplary stage of SLS processing according to a second exemplary embodiment of the method of the present invention. Using the exemplary embodiment of the method shown in FIG. 9, longer grains can be grown on the silicon thin film 52. This exemplary embodiment of the method according to the present invention can be implemented in a substantially the same manner as the embodiment described above with reference to FIGS. 4, 5A–5G and 6A–6B, while utilizing the intensity pattern 600 instead of the intensity pattern 235 to irradiate, and completely melt the silicon thin film 52 in the first conceptual column 210 of the sample 40.

In particular, FIG. 9 illustrates this exemplary embodiment when the silicon thin film 52 in the first conceptual column 210 of the sample 40 is irradiated by the intensity pattern 600, while the sample 40 is continuously translated in the Y-direction. The silicon thin film 52 in the areas 650, 652, 654, 656, 658, 660, 662, 664, 666, 668, etc. of the first conceptual column 210 of the sample 40 are completely melted throughout its thickness. It should be understood that these particular areas are being irradiated because the slit-shaped beamlets 601, 603, 605, 607, 609, 611, 613, 615, 617, 619, etc. of the intensity pattern 600 of the masked irradiated beam pulse 164 impinged such areas 650, 652, 654, 656, 658, 660, 662, 664, 666, 668, etc. to completely melt the silicon thin film 52 provided therein (i.e., throughout the thickness of the silicon thin film 52).

The silicon thin film 52 provided in most of the areas 650 was not subjected to the previous lateral solidification. With the respect to the area 652, the slit-shaped beam 603 impinging on the silicon thin film 52 provided in this area 652 melts more than half of the re-solidified section of corresponding to the location thereof (which was previously irradiated by the slit-shaped beamlet 601). In particular, the top edge of the area 652 is provided slightly above a line M on which a boundary 644 extend along the M-axis, the boundary 644 being formed by the previous irradiation and grain growth by the slit-shaped beamlet 601. It should be understood that due to such position of the area 652, the center 653 thereof is provided above a line N along which a lower edge of the area 650 extends. Similarly, the center 655 of the area 654 is positioned slightly above an axis along with the lower edge of the area 652 extends, the center 657 of the area 656 is positioned slightly above a line along with the lower edge of the area 654 extends, and the center 659 of the area 658 is positioned slightly above an axis along with the lower edge of the area 656 extends. Therefore, the areas 650, 652, 654, 656, 658 are provided in a configuration which substantially corresponds to that of the slit-shaped beamlets 601, 603, 605, 607, 609 of the first row 640 of the intensity pattern 600 of the masked irradiated beam pulse 164.

The areas 660, 662, 664, 666, 668, in which the silicon thin film 52 is completely melted throughout its thickness, are arranged in a substantially the same configuration as that of the areas 650, 652, 654, 656, 658, except that the area 660 is provided at an offset, along the −X direction, from the area 650, with the distance of the offset being approximately equal to the distance 635 between the slit-shaped beamlet 601 and the slit-shaped beamlet 611 as described above with reference to FIG. 8. In addition, the area 658 has a small portion 670 which overlaps the region of the silicon thin film 52 which was previously irradiated by the slit-shaped beamlet 611. It is preferable to utilize this small portion 670 such that the small grain regions provided at the edges of the re-solidified areas of the silicon thin sample 52 are minimized or even eliminated.

Figure 10:
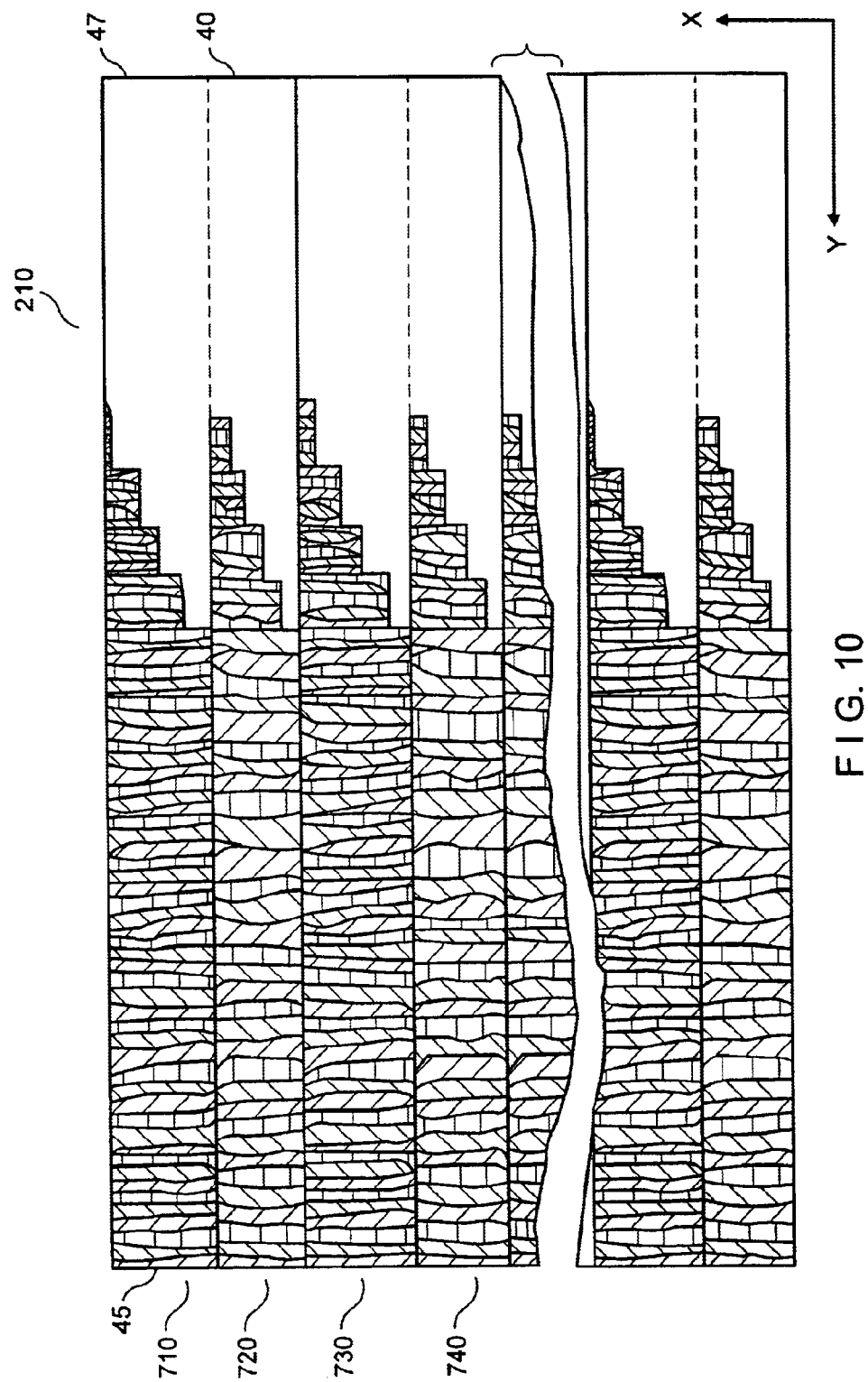
FIG. 10 shows an illustrative diagram of a further progression of the SLS processing of FIG. 9 for the silicon thin film of the sample after the beam pulses complete the irradiation of a particular portion of the first conceptual column of the sample, which then crystallizes.

FIG. 10 shows the progression of the SLS of the first column 210 using the mask of FIG. 8 as the sample 40 is continuously translated along the Y-direction. In this manner, a number of rows 710, 720, 730, etc. of the silicon thin film 52 in the first conceptual column 210 are produced. The number of these rows 710, 720, 730, etc. corresponds to the number of the rows 640, 641, 642, etc. of the intensity pattern 600 illustrated in FIG. 8. Similarly to the method of FIG. 4, when the sample 40 is translated so that the masked irradiated beam pulse 164 reaches the lower edge 47 of the sample 40, and the masked irradiated beam pulse 164 no longer impinges the silicon thin film 52 provided on the sample 40, the sample is translated in the X-direction to reach a particular location to position the sample 40 for further translation so that the irradiation beam 164 may impinge the silicon thin film 52 in the second conceptual column 220 of the sample 40. Thereafter, the sample 40 is translated in the −Y direction and the silicon thin film 52 in the second conceptual column 220 of the sample 40 is irradiated in a substantially the same manner as provided above with reference to FIGS. 9 and 10. However, the slit-shaped beamlets 609, 619 (and not the slit-shaped beamlets 601, 611) first irradiate the silicon thin film 52 in the second conceptual column 220, starting from the lower edge 47, and completing the irradiation of the second column of the sample 40 at the top edge 45. In this manner, the silicon thin film 52 in all conceptual columns of the sample 40 can be effectively subjected to the continuous motion SLS, with longer grains being grown thereon.

The exemplary velocity V to translate the sample 40 and irradiate it using the intensity profile 600 of the masked irradiated beam pulse 164 illustrated in FIG. 8 is provided as follows:

$$V = L_B * f_{LASER} \quad (6)$$

where $L_B$ is the width of one of the slit-shaped beamlets 601, 603, 605, 607, 609, 611, 613, 615, 617, 619, etc. of the intensity pattern 600 shown in FIG. 8, and $f_{LASER}$ is the frequency of the irradiation beam 149 emitted by, e.g., the excimer laser 110. In the exemplary embodiment illustrated in FIG. 8, LB equals to 0.2 mm, and $f_{LASER}$ can equal to 300 hertz. Thus the exemplary velocity V of the sample translation can equal to 60 mm/seconds for five (5) beamlets provided in each row 640, 641, 642, etc. of the intensity pattern 600. According to the exemplary embodiment of the present invention, if the number of slit-shaped beamlets of the intensity profile 600 per row increases to, e.g., ten (10) slits, then the length of each slit-shaped beamlet is preferably reduced by half to, e.g., 0.1 mm. Therefore, with 10 slit-shaped beamlets per column of the intensity pattern 600 and using the above calculations, the velocity of the sample translation is equal to 30 mm/second. However, using a higher number of the slit-shaped beamlets in a single row of the intensity pattern 600, it is possible to obtain longer grains on the silicon thin film 52 of each conceptual column of the sample 40.

Figure 11:
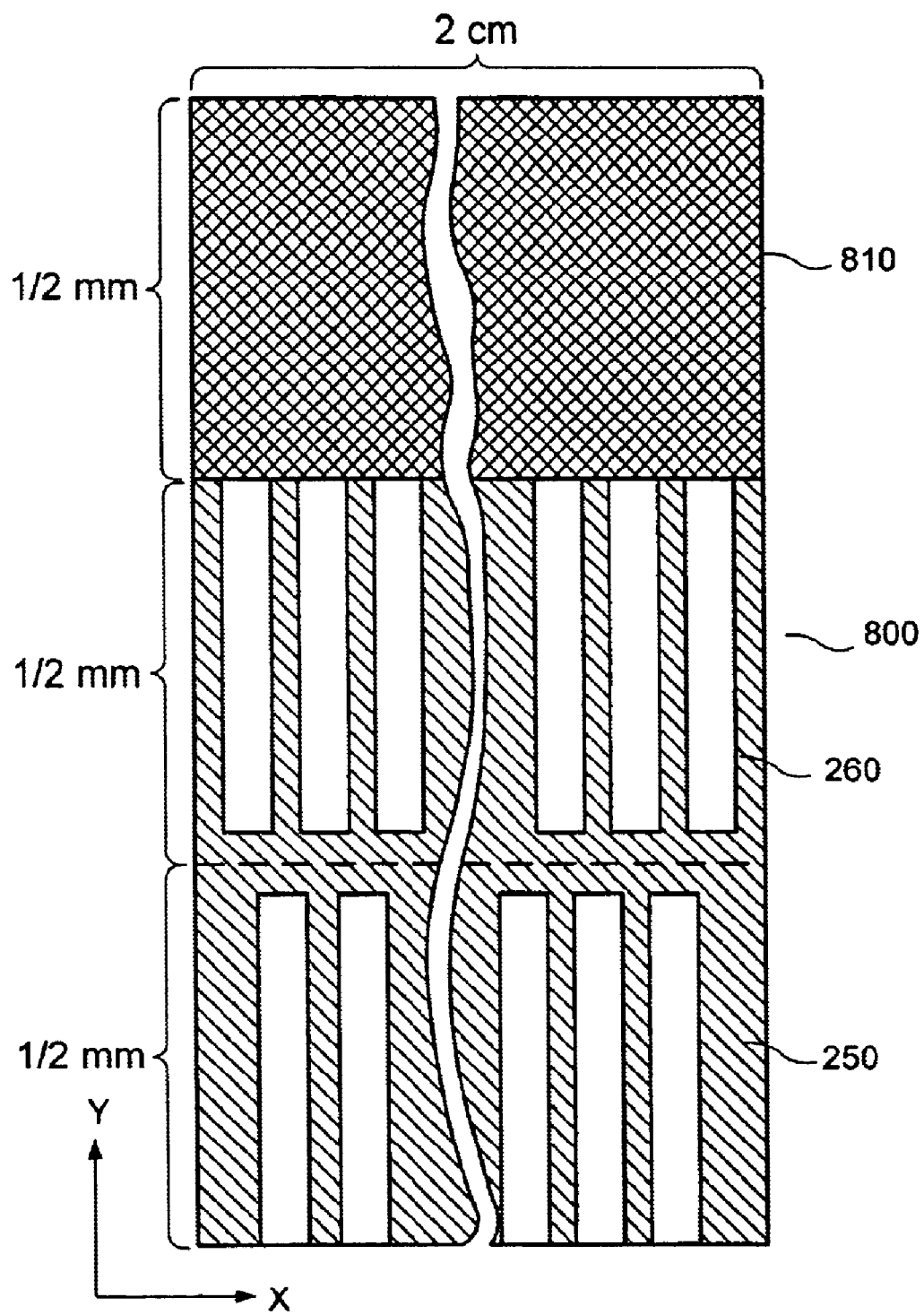
FIG. 11 shows an enlarged illustration of a third exemplary embodiment of an intensity pattern of the irradiation beam pulse as defined by another mask utilized by the system and method of the present invention as it impinges the silicon thin film of the sample, which includes a single lower-energy portion provided adjacent to one section of slit-shaped beamlets of the irradiation beam pulse.

FIG. 11 shows an enlarged illustration of a third exemplary embodiment of an intensity pattern 800 of the irradiation beam pulse as defined by another mask 150 utilized by the system and method of the present invention as it impinges the silicon thin film on the substrate. Similar to the intensity pattern 235 of FIG. 3, the intensity pattern 800 includes the first beamlet section 250 and the second beamlet section 260. In addition, the intensity pattern 800 includes one reduced intensity section 810 bordering the second beamlet section 260. The reduced intensity portion 810 has only 70% of the intensity of the homogenized irradiation beam 149, and can be generated by a gray-scale portion of the mask 150 by irradiation the homogenized irradiation beam 149 through such gray-scale portion of the mask 150. This reduced intensity portion 810 does not melt an area of the silicon thin film 52 which it impacts throughout the entire thickness thereof; indeed, this reduced intensity portion 810 of the masked irradiated beam pulse 164 only partially melts the area of the silicon thin film 52 that it irradiates.

The intensity pattern 800 shown in FIG. 11 can be used for irradiating the sample 40 via the exemplary embodiment of the method according to the present invention illustrated in FIGS. 5A–5G and 6A–6E. Due to the presence of the reduced intensity portion 810 in the intensity pattern 800, the width of the cross-section of the masked irradiated beam pulse 164 can be approximately 1.5 mm (as opposed to having the width of the masked irradiated beam pulse 164 being 1 mm as provided for the intensity pattern 235 of FIG. 3) so as to utilize all areas of the intensity pattern 800, including the reduced intensity portion 810. However, while the width of the masked irradiated beam pulse 164 is increased, the sample 40 may be translated at the same predetermined velocity as the velocity used with the intensity pattern 235 with reference to FIGS. 4, 5A–5G and 6A–6B.

The illustration of the continuous motion SLS process according to the present invention using the intensity pattern 800 is substantially the same as for the intensity pattern 235 for the first two irradiation beam pulses impacting the silicon thin film 152 as provided above with reference to FIGS. 5A–5D. However, for the third irradiation beam pulse shown in FIG. 5E, the area labeled as 820 would be completely irradiated using the reduced intensity portion 810 of the intensity pattern 800. While the area 820 is irradiated by the reduced intensity portion 810 of the intensity pattern 820, it is only partially melted. Thereafter, the area 820 re-solidifies while maintaining the integrity of the grains grown therein. This partial melting is advantageous because upon re-solidification of the area 820, the surface thereof is flattened, and thus peaks and valleys on this surface are minimized. This procedure continues for the first conceptual column 210 of the sample 40 until the sample 40 is continuously translated so that the masked irradiated beam pulse 164 just passes the bottom edge 47 of the sample 40.

The procedure described above with reference to FIG. 4 is continued in a substantially the same manner as described above which utilizes the intensity pattern 235. However, according to this embodiment of the method according to the present invention which utilizes the intensity pattern 800 for irradiating the silicon thin film 52 provided on the sample 40, after the masked irradiated beam pulse 164 stops impinging any area of the first column 210 of the sample 40, and before it starts impinging the second column 220 of the sample 40, the reduced intensity portion 810 of the intensity pattern 800 is placed such that when the masked irradiated beam pulse 164 starts irradiating the second conceptual column 220 of the sample 40. Thus, the reduced intensity portion 810 of the intensity pattern 800 of the masked irradiated beam pulse 164 is provided at the back of the two beamlet sections 250, 260 of the intensity pattern 800. This can be done by, e.g., rotating the mask 150 by 180°. In this manner, the reduced intensity portion 810 can partially irradiate the previously-irradiated and re-solidified areas of the second column 220 (i.e., already subjected to the SLS via the beamlets of the first and second beamlet sections 250, 260 of the intensity pattern 800). Upon reaching the top edge 45 of the sample, the reduced intensity portion 810 of the intensity pattern 800 can again be placed in the same configuration as was utilized when the first conceptual column 210 of the sample 40 was being irradiated by the masked irradiated beam pulse 164 (e.g., by rotating the gray-scale portion of the mask 150 by 180°). In this manner, the silicon thin film 52 of the entire sample 40 can be effectively subjected to the continuous motion SLS, while flattening the surface of the irradiated, re-solidified and crystalized silicon thin film 52 on the entire periphery thereof.

FIG. 12 shows an enlarged illustration of a fourth exemplary embodiment of an intensity pattern 830 of the irradiated beam pulse as conceptually defined by yet another mask utilized by the system and method of the present invention, as it impinges the silicon thin film on the substrate. Similar to the intensity pattern 800 of FIG. 3, the intensity pattern 830 includes the first beamlet section 250, the second beamlet section 260 and a first reduced intensity section 810 bordering the second beamlet section 260. In addition, the intensity pattern 830 includes second reduced intensity section 810 bordering the first beamlet section 250. As with the first reduced intensity portion 810, the second reduced intensity portion 840 has only 70% of the intensity of the homogenized irradiation beam 149, and can be generated by another gray-scale portion of the mask 150 by irradiation the homogenized irradiation beam 149 there through.

It should be understood that the intensity pattern illustrated in FIG. 12 is shown as if both first and second reduced intensity portions 810, 840 are being used for irradiating the silicon thin film 52 provided on the sample 40. However, as shall be described in further detail below, only one of these reduced intensity portions 810, 840 of the intensity pattern 830 are to be used for such irradiation.

The intensity pattern 830 shown in FIG. 12 can be used for irradiating the silicon thin film 52 with the method according to the present invention in a similar manner as described above with reference to the use of the intensity pattern 800 of FIG. 11. Again, the width of the cross-section of the masked irradiated beam pulse 164 is also approximately 1.5 mm. In particular, when the sample 40 is continuously translated so that the masked irradiated beam pulse 164 irradiates the first conceptual column 210, only the first beamlet section 250, the second beamlet section 260 and the first reduced intensity portion 810 of the intensity pattern 830 of the masked irradiated beam pulse 164 is irradiated and impinges the silicon thin film 52 on the sample 40, while the second reduced in tensity portion 840 is not utilized. Then, the procedure for the SLS of the first conceptual column 210 continues in substantially the same manner as the procedure described above for the first conceptual column 210 which uses the intensity pattern 800.

Then, after the masked irradiated beam pulse 164 stops impinging any area of the first conceptual column 210, and before it starts impinging the second conceptual column 220 of the sample 40, the mask 150 is positioned or shifted in the Y-direction by the mask translation stage such that the second reduced intensity portion 840 of the intensity pattern 830 is utilized when the masked irradiated beam pulse 164 starts irradiating the second conception column 220 of the sample, while not utilizing the first reduced intensity portion 810 for any irradiation of the silicon thin film 52 in the second conceptual column 220 of the sample. In this manner, the second reduced intensity portion 840 of the intensity pattern 830 of the masked irradiated beam pulse 164 is provided at the back end of the first and second sections 250, 260 of the intensity pattern 830 of the masked irradiated beam pulse 164 to irradiate the silicon thin film 52 in the second conceptual column 220 of the sample 40. Upon reaching the top edge 45 of the sample 40, the mask 150 is positioned or shifted in the negative Y-direction by the mask translation stage so that the intensity pattern 830 is provided in the same configuration as was utilized when the first conceptual column 210 of the sample 40 was irradiated by the masked irradiated beam pulse 164.

FIGS. 13A–13D show the radiation beam pulse intensity pattern and the grain structure of a portion of an exemplary first conceptual column of a silicon thin film 52 on the sample 40 at various sequential stages of SLS processing according to another exemplary embodiment of the method of the present invention. In this exemplary embodiment, the silicon thin film 52 of the entire sample 4C has already undergone the continuous motion SLS, and then rotated 90° in a clock-wise direction by the sample translation stage 180 (i.e., controlled by the computer 106). After such rotation, the sample 40 is again conceptually subdivided into, e.g., 15 columns, the sample 40 is translated in the same manner as described above with reference to FIGS. 4, 5A–5G and 6A–6B.

Figure 13A:
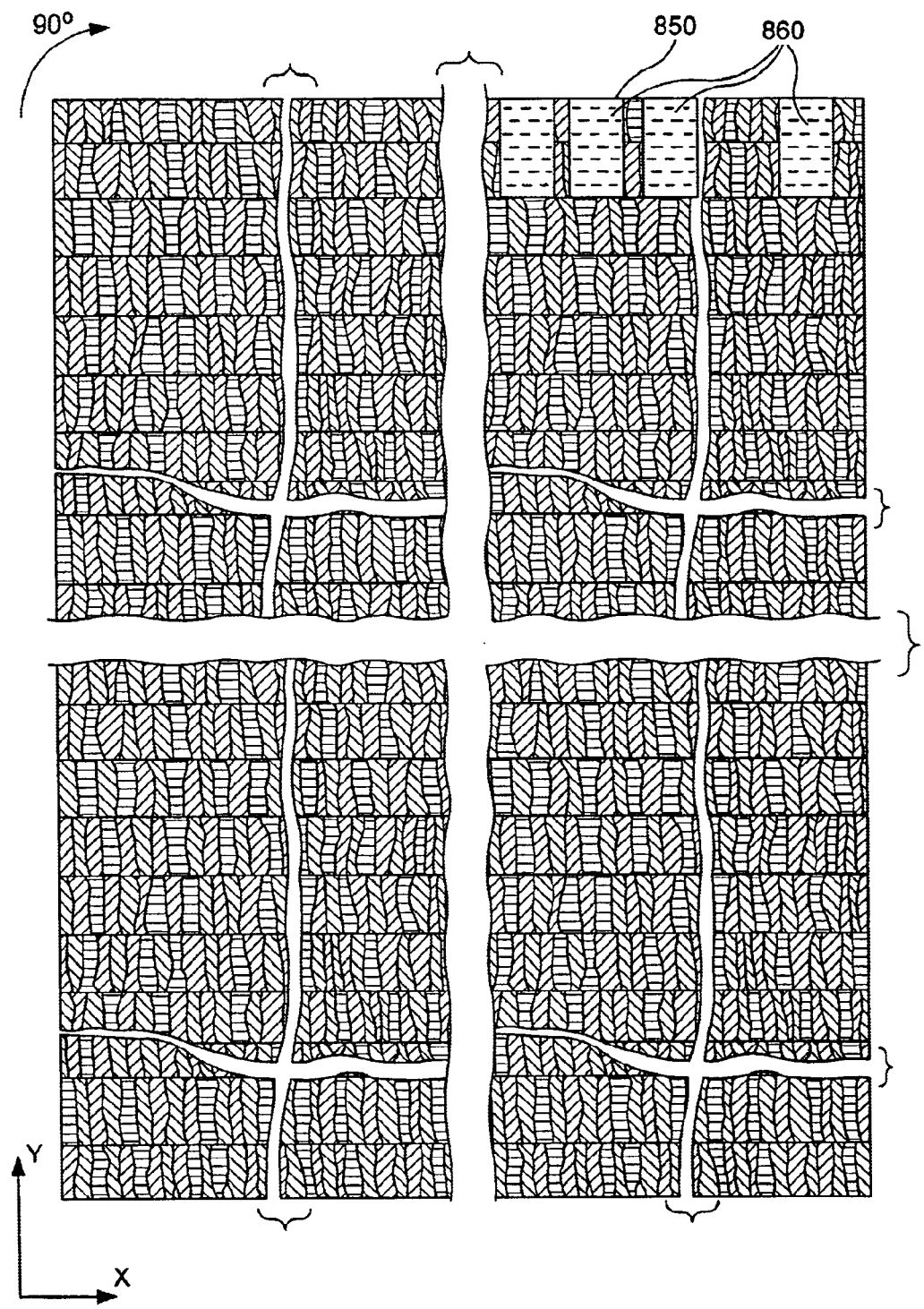
Figure 14:
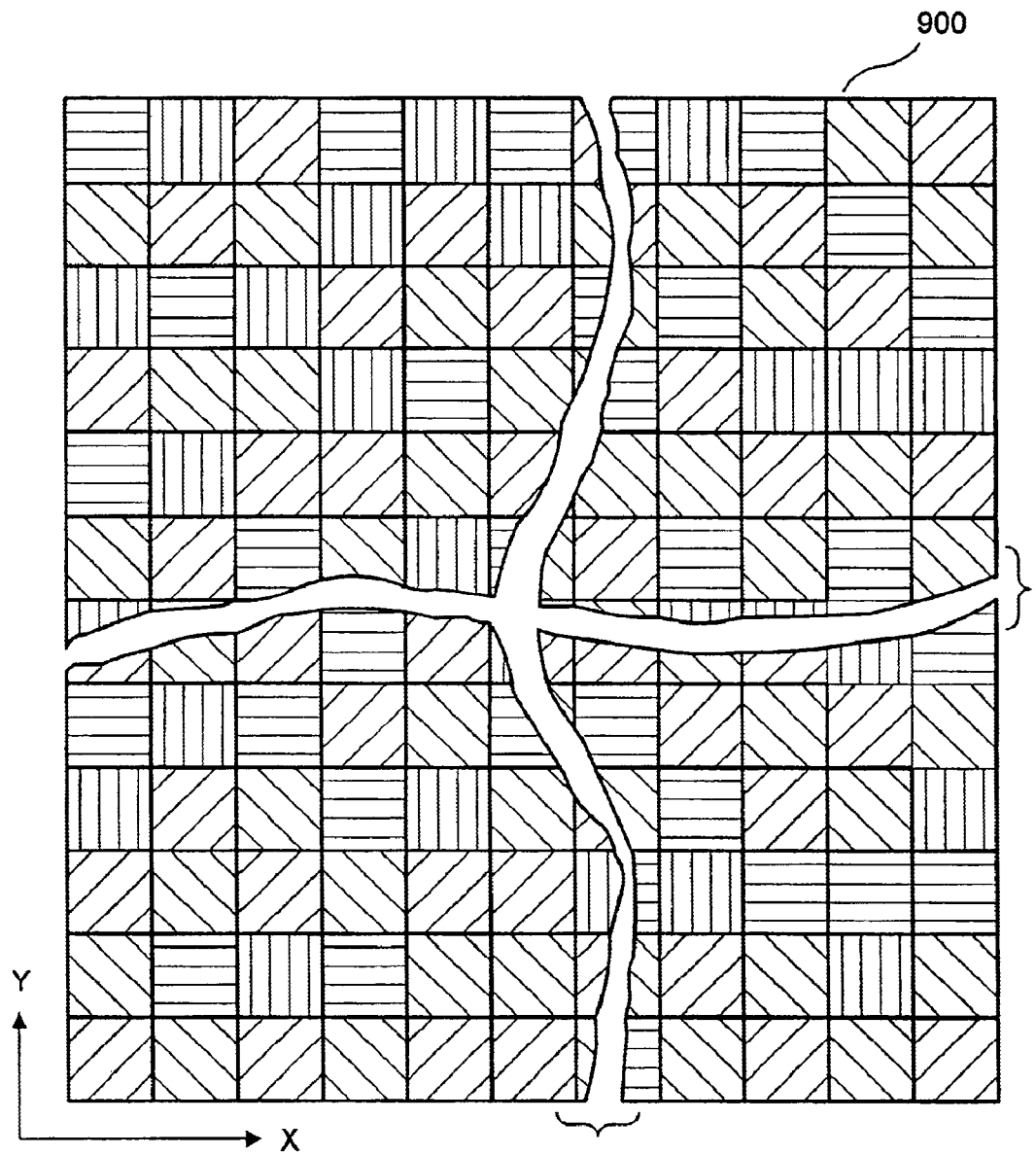
FIG. 14 shows an illustrative diagram of the crystallized silicon film of the sample after the silicon thin film in all conceptual columns of the rotated sample have been completely melted, re-solidified and crystalized using the technique illustrated in FIGS. 13A–13D.

In particular, FIG. 13A shows melted areas 860 of a first conceptual column 850 which were irradiated by the beamlets 255 of the first beamlet section 250 of the intensity pattern 235 illustrated in FIG. 3, as the sample 40 is continuously translated the Y-direction. As discussed above for the areas 210 in reference to FIG. 5A, the areas 860 are melted throughout their entire thickness. Contrary to the areas 210, the areas 860 of the first column 850 were previously subjected to the SLS prior to their melting. Then, as shown in FIG. 13B, the areas 860 cool, re-solidify and re-crystalize. The grain seeding and growth takes place starting from the borders of the areas 860. In this embodiment, because the silicon thin film 52 of the sample 40 had already underwent the SLS, the grains provided at the edges of the areas 860 (which were grown in the controlled manner) seed the areas 860, and start growing into the re-solidifying areas 860 to form areas 865 which have larger areas of single grain growth. The procedure continues as shown in FIG. 13C such the sample 40 is translated in the Y-direction and irradiated in a substantially similar manner as described above with reference to FIG. 5C. Similarly to the areas 435, 445, certain areas 870, 875 of the silicon thin film 52 in the first conceptual column 850 are melted. As with the areas 435, 445, particular portions of the areas 870, 875 overlap certain portions of the previously irradiated and re-solidified areas 865 of FIG. 13B. As shown in FIG. 13D, upon cooling and re-solidification of the areas 870, the lateral grain growth is seeded and promoted from their borders using the grains grown using the process described above with reference to FIGS. 5A–5G to form the resultant areas 885. With respect to the cooling, re-solidification and re-crystallization of the areas 875, the grain growth in the resultant areas 880 is promoted using the grains of the re-solidified areas 865 provided at the borders of the areas 875. According to the procedure described above with reference to FIGS. 13A–13D as it relates to the technique described above with reference to FIGS. 5A–5G and 6A–6B, its is possible to effectuate the SLS which provides larger regions 900 of single grains on the silicon thin film 52 of the sample 40, as illustrated in FIG. 14.

Figure 15A:
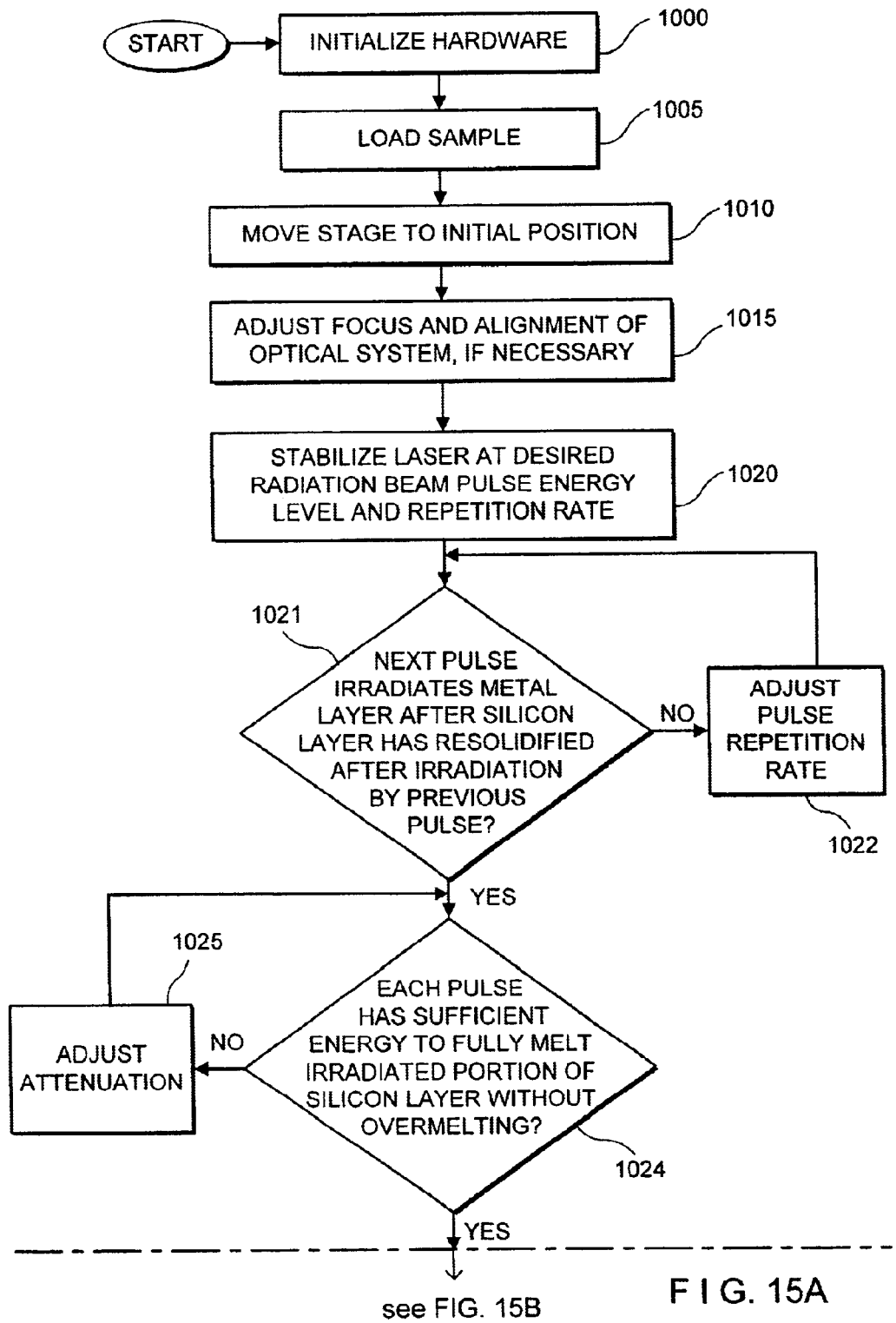
FIG. 15 shows a flow diagram illustrating the steps implemented by the system of FIG. 1 and the method illustrated in FIGS. 5A–5G and 6A–6B according to one exemplary embodiment of the present invention.
Figure 15B:
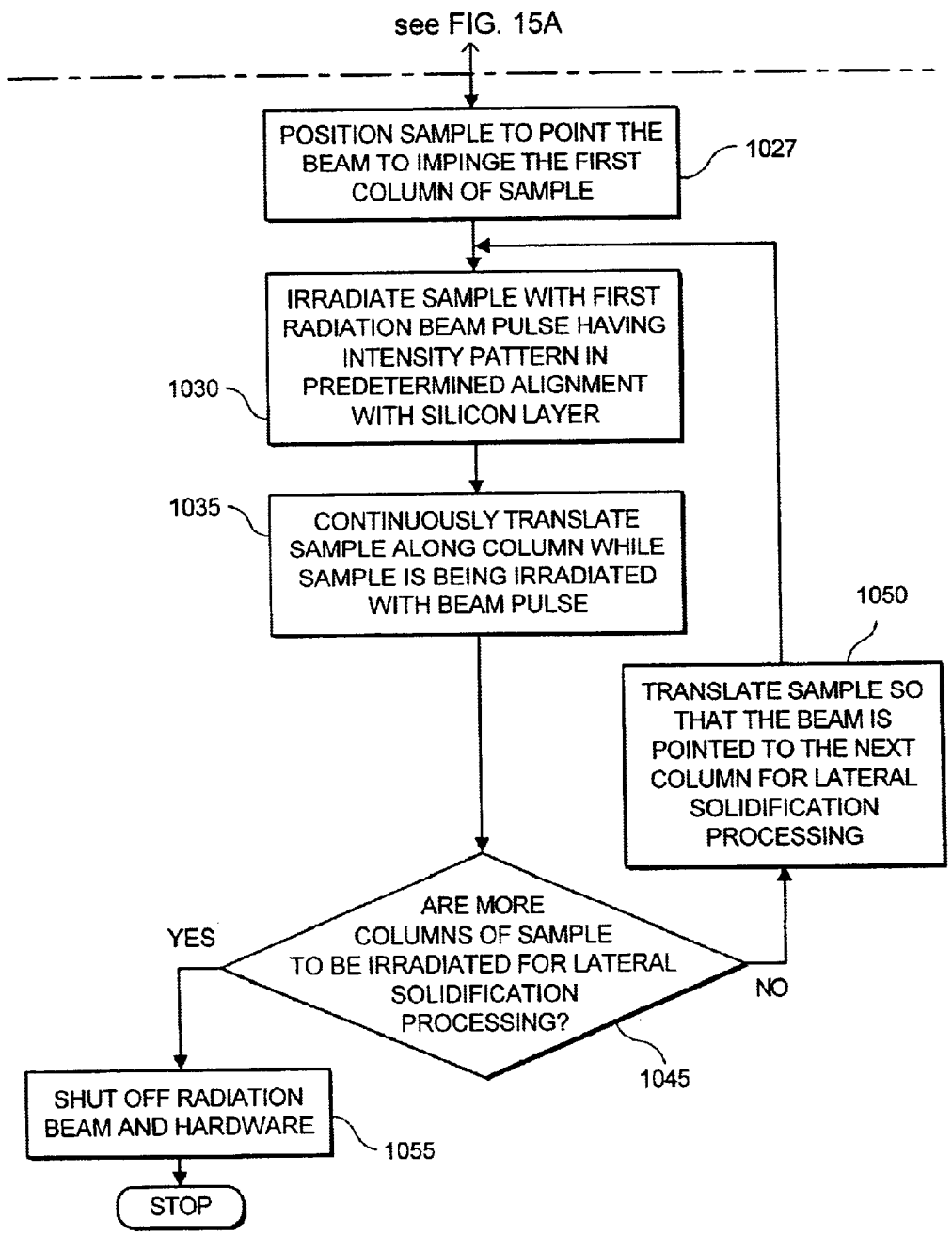

Referring next to FIG. 15, there is shown a flow diagram of exemplary steps carried out with the aid of the computer 106 (or other control devices) for the single-step, continuous motion SLS processing in accordance with the present invention to control the shape and size of grains, and the location and orientation of grain boundaries in the silicon thin film 52 of the sample 40. As shown in the flow diagram of FIG. 15, in step 1000 the hardware components of the system of FIG. 1, such as the excimer laser 110, the beam energy density modulator 120, the beam attenuator 130 and the shutter 152 are first initialized at least in part by the computer 106. A sample 40 is loaded onto the sample translation stage 180 in step 1005. It should be noted that such loading may be performed either manually or automatically using known sample loading apparatus under the control of the computer 106. Next, the sample translation stage 180 is moved, preferably under the control of the computer 106, to an initial position in step 1010. The various other optical components of the system are adjusted manually or under the control of the computer 106 for a proper focus and alignment in step 1015, if necessary. The radiation beam pulses 164 are then stabilized in step 1020 to a desired intensity, pulse duration and pulse repetition rate. In step 1021, it is determined whether a next radiation beam pulse irradiates the silicon thin film 52 after each melted region thereof has completely re-solidified following the irradiation by a previous radiation beam pulse. If not, in step 1022, the pulse repetition rate of the excimer laser 110 is adjusted. In step 1024 it is determined whether each beamlet of the intensity pattern of each radiation beam pulse has sufficient intensity to melt each one of the silicon thin film 52 overlapped thereby throughout its entire thicknesses without melting an adjacent region overlapped by a shadow region of the intensity pattern. If under-melting or over melting occurs, in step 1025, the attenuator 130 is adjusted so that each radiation beam pulse has sufficient energy to fully melt the metal layer in irradiated areas without over melting adjoining unirradiated regions.

In step 1027, the sample 40 is positioned to point the masked irradiated beam pulse 164 at the first conceptual column 210 of the sample 40. In step 1030, the current column of the sample 40 is irradiated using the radiation beam pulse 164 having an intensity pattern controlled by the mask 150, 700, 800, 830. In step 1035, the sample 60 is continuously translated so that the masked irradiated beam pulse 164 irradiates the silicon thin film 52 along the current column of the sample 40 in a predetermined direction.

In step 1045, it is determined whether all conceptual columns of the sample 40 having the silicon thin film 52 provided thereon have been subjected to the SLS processing. If not, the sample 40 is translated to the next unirradiated conceptual column of the sample 40, and the process loops back to step 1030 for a further translation along a predetermined direction (e.g., an opposite direction), and for the irradiation of the next conceptual column of the sample 40 by the radiation beam pulse 164. If the SLS processing has been completed for all columns of the sample 40, the hardware components and the beam of the system shown in FIG. 1 can be shut off (step 1055), and the process terminates.

The foregoing exemplary embodiments merely illustrate the principles of the present invention. Various modifications and alterations to the described embodiments will be apparent to those skilled in the art in view of the teachings herein without departing from the scope of the invention, as defined by the appended claims.

What is claimed is:

1. A method for processing a silicon thin film sample on a substrate having a surface portion that does not seed crystal growth in the silicon thin film, the film sample having a first edge and, a second edge, the method comprising the steps of:
   (a) controlling an irradiation beam generator to emit successive irradiation beani pulses at a predetermined repetition rate;
   (b) masking each of the irradiation beam pulses to define a first plurality of beamlets and a second plurality of beamlets, the first and second plurality of beamlets of each of the irradiation pulses being provided for impinging the film sample and having an intensity which is sufficient to melt irradiated portions of the film sample throughout their entire thickness;
   (c) continuously scanning, at a constant predetermined speed, the film sample so that a successive impingement of the first and second beamlets of the irradiation beam pulses occurs in a scanning direction on the film sample between the first edge and the second edge;
   (d) during step (c), successively irradiating a plurality of first areas of the film sample by the first beamlets of the irradiation beam pulses so that the first areas are melted throughout their thickness and leaving unirradiated regions between respective adjacent ones of the first areas;
   (e) during step (c), allowing each one of the first areas irradiated by the first beaxnlets of each of the irradiation beam pulses to re-solidify and crystalize; and
   (f) during step (e), successively irradiating a plurality of second areas of the film sample by the second beamlets of the irradiation beam pulses so that the second areas are melted throughout their thickness, wherein each one of the second areas partially overlaps a respective pair of the re-solidified and crystalized first areas and the respective unirradiated region therebetween.

2. The method of claim 1, further comprising the step of:
   (g) during step (f), successively irradiating third areas of the film sample by the first beaxnlets to completely melt the third areas throughout their thickness, each of the third areas partially overlapping a respective one of the re-solidifiedandcrystalized first areas and leaving further unirradiated regions between respective adjacent ones of the third areas.

3. The method of claim 2,
   wherein one of the first areas and one of the third areas lie on a first line which is parallel to the scanning direction,
   wherein one of the second areas lies of a second line which is parallel to the scanning direction, and
   wherein the first line extends at an offset from the second line.

4. The method of claim 2, further comprising the step of:
   (h) during step (g), allowing each one of the second areas irradiated by the first beamlets of each of the irradiation beam pulses to re-solidify and crystalize.

5. The method of claim 4, further comprising the steps of:
   (i) during step (c), allowing each one of the third areas irradiated by the first beamlets of each of the irradiation beam pulses to re-solidify and crystalize; and
   (j) during steps (h) and (i), successively irradiating a plurality of fourth areas of the film sample by the second beamlets of the irradiation beam pulses so that the fourth areas are melted throughout their thickness, wherein each one of the fourth areas partially overlaps a respective pair of the re-solidified and crystalized third areas and the respective further unirradiated region therebetween.

6. The method of claim 1, wherein the first edge is located on a side of the film sample which is opposite from a side of the film sample on which the second edge is located.

7. The method of claim 6, wherein steps (c) through (f) are continued until the successive impingement by the first and second beamlets of the irradiation beam pulses the film sample passes the second edge of the film sample, and further comprising the steps of:

(k) after steps (c) through (f), positioning the film sample so that the first and second beamlets of the irradiation beam pulses impinge on at a first location outside of boundaries of the film sample with respect to the film sample; and (l) after step (k), positioning the film sample so that the successive impingement of the first and second beamlets with respect to the film sample moves from the first location to a second location, the second location being outside of the boundaries of the film sample.

8. The method of claim 7, wherein, after steps (c) through (f) and before step (k), a completed portion of the film sample having a predetermined width has been irradiated, melted throughout its entire thickness and re-solidified, the film sample having a controlled crystalline grain growth in the entire cross-section of the completed portion.

9. The method of claim 8, wherein the particular direction extends along a first axis, wherein, instep (l), the film sample is translated along a second axis, the first axis being perpendicular to the first axis, and wherein the second location is provided at the distance from the first location approximately equal to the predetermined width.

10. The method of claim 9, further comprising the steps of:

(m) after step (l), continuously scanning, at the constant predetermined speed, the film sample so that the successive impingement of the first and second beamlets of the irradiation beam pulses occurs in a further direction on the film sample between the second edge and the first edge, the further direction being opposite to the scanning direction; and (n) during step (m), successively irradiating a plurality of fifth areas of the film sample with the second beamlets of the irradiation beam pulses so that the fifth areas are melted throughout their thickness and leaving additional unirradiated regions between respective adjacent ones of the fifth areas;

(o) during step (m), allowing each one of the fifth areas irradiated by the second beamlets of each of the irradiation beam pulses to re-solidify and crystalize; and (p) during step (o), successively irradiating a plurality of sixth areas of the film sample by the first beamlets of the irradiation beam pulses so that the sixth areas are melted throughout their thickness, wherein each one of the sixth areas partially overlaps a respective pair of the re-solidified and crystalized fifth areas and the respective additional unirradiated region therebetween.

11. The method of claim 1, wherein steps (a) through (f) are performed without executing any microtranslation of the impingement of the first and second beamlets of the irradiation beam pulses with respect to the film sample.

12. The method of claim 1, further comprising the steps of:

(q) during step (g), allowing each one of the second areas irradiated by the first beamlets of each of the irradiation beam pulses to re-solidify and crystalize;

(r) masking portions of the irradiation beam pulses to emit successive partial intensity irradiation pulse which have a reduced intensity so that when the successive partial intensity irradiation pulses irradiate a particular region of the film sample, the particular region is melted for less than the entire thickness of the film sample;

(s) after steps (q) and (r). successively irradiating each of the re-solidified and crystalized second areas by the respective one of the successive partial intensity irradiation pulses.

13. A system for processing a silicon thin film sample on a substrate having a surface portion that does not seed crystal growth in the silicon thin film, the film sample having a first edge and a second edge, the system comprising:

a memory storing a computer program; and a processing arrangement executing the computer program to perform the following steps:

(a) controlling an irradiation beam generator to emit successive irradiation beam pulses at a predetermined repetition rate, (b) masking each of the irradiation beam pulses to define a first plurality of beamlets and a second plurality of beamlets, the first and second plurality of beamlets of each of the irradiation pulses being provided for impinging the film sample and having an intensity which is sufficient to melt irradiated portions of the film sample throughout their entire thickness, (c) continuously scanning, at a constant predetermined speed, the film sample so that a successive impingement of the first and second beamlets of the irradiation beam pulses occurs in a scanning direction on the film sample between the first edge and the second edge, (d) during step (c), successively irradiating a plurality of first areas of the film sample using the first beamlets of the irradiation beam pulses so that the first areas are melted throughout their thickness and leaving unirradiated regions between respective adjacent ones of the first areas, (e) during step (c), allowing each one of the first areas irradiated using the first beamlets of each of the irradiation beam pulses to re-solidify and crystalize, and (f) during step (e), successively irradiating a plurality of second areas of the film sample using the second beamlets of the irradiation beam pulses so that the second areas are melted throughout their thickness, wherein each one of the second areas partially overlaps a respective pair of the re-solidified and crystalized first areas and the respective unirradiated region therebetween.

14. The system of claim 13, wherein, during step (f), the processing arrangement successively irradiates third areas of the film sample using the first beamlets to completely melt the third areas throughout their thickness, each of the third areas partially overlapping a respective one of the re-solidified and crystalized first areas and leaving further unirradiated regions between respective adjacent ones of the third areas.

15. The system of claim 14, wherein one of the first areas and one of the third areas lie on a first line which is parallel to the scanning direction, wherein one of the second areas lies of a second line which is parallel to the scanning direction, and wherein the first line extends at an offset from the second line.

16. The system of claim 14, wherein, after the third areas are being irradiated by the first beamlets, each one of the second areas irradiated using the first beamlets of each of the irradiation beam pulses is allowed to re-solidity and crystalize.

17. The system of claim 16, wherein, during step (c), each one of the third areas irradiated using the first beamlets of each of the irradiation beam pulses is allowed to re-solidify and crystalize, and wherein, after the second and third areas re-solidify and crystalize, the processing arrangement successively irradiates a plurality of fourth areas of the film sample using the second beamlets of the irradiation beam pulses so that the fourth areas are melted throughout their thickness, wherein each one of the fourth areas partially overlaps a respective pair of the re-solidified and crystalized third areas and the respective further unirradiated region therebetween.

18. The system of claim 13, wherein the first edge is located on a side of the film sample which is opposite from a side of the film sample on which the second edge is located.

19. The system of claim 18, wherein the processing arrangement performs steps (c) through (f) until the successive impingement by the first and second beamlets of the irradiation beam pulses the film sample passes the second edge of the film sample, wherein, after steps (c) through (f), the processing arrangement positions the film sample so that the first and second beamlets of the irradiation beam pulses impinge on at a first location outside of boundaries of the film sample with respect to the film sample, and wherein, after the irradiation beam pulse impinge on the first location, the processing arrangement positions the film sample so that the successive impingement of the first and second beamlets with respect to the film sample moves from the first location to a second location, the second location being outside of the boundaries of the film sample.

20. The system of claim 19, wherein, after steps (c) through (f) and after the successive impingement of the irradiation beam pulses passes the second edge of the film sample, a completed portion of the film sample having a predetermined width has been irradiated, melted throughout its entire thickness and re-solidified, the film sample having a controlled crystalline grain growth in the entire cross-section of the completed portion.

21. The system of claim 20, wherein the particular direction extends along a first axis, wherein the processing arrangement translates the successive impingement from the first location to the second location with respect to the film sample along a second axis, the first axis being perpendicular to the first axis, and wherein the second location is provided at the distance from the first location approximately equal to the predetermined width.

22. The system of claim 21, wherein the processing arrangement performs the following further steps:

(g) after the successive impingement is translated from the first location to the second location, continuously scanning, at the constant predetermined speed, the film sample so that the successive impingement of the first and second beamlets of the irradiation beam pulses occurs in a further direction on the film sample between the second edge and the first edge, the further direction being opposite to the scanning direction, and (h) during step (g), successively irradiating a plurality of fifth areas of the film sample with the second beamlets of the irradiation beam pulses so that the fifth areas are melted throughout their thickness and leaving additional unirradiated regions between respective adjacent ones of the fifth areas;

(i) during step (g), allowing each one of the fifth areas irradiated by the second beamlets of each of the irradiation beam pulses to re-solidify and crystalize; and (j) during step (i), successively irradiating a plurality of sixth areas of the film sample by the first beamlets of the irradiation beam pulses so that the sixth areas are melted throughout their thickness, wherein each one of the sixth areas partially overlaps a respective pair of the re-solidified and crystalized fifth areas and the respective additional unirradiated region therebetween.

23. The system of claim 13, wherein the processing arrangement performs steps (a) through (f) without executing any microtranslation of the impingement of the first and second beamlets of the irradiation beam pulses with respect to the film sample.

24. The system of claim 13, wherein the processing arrangement performs the following further steps:

(k) after the first beamlets successively irradiate the third areas, allowing each one of the second areas irradiated by the first beamlets of each of the irradiation beam pulses to re-solidify and crystalize, (l) masking portions of the irradiation beam pulses to emit successive partial intensity irradiation pulse which have a reduced intensity so that when the successive partial intensity irradiation pulses irradiate a particular region of the film sample, the particular region is melted for less than the entire thickness of the film sample, (m) after steps (k) and (l), successively irradiating each of the re-solidified and crystalized second areas by the respective one of the successive partial intensity irradiation pulses.

* * * * *

UNITED STATES PATENT AND TRADEMARK OFFICE
CERTIFICATE OF CORRECTION

PATENT NO. : 6,908,835 B2
DATED : June 21, 2005
INVENTOR(S) : Sposili et al.

It is certified that error appears in the above-identified patent and that said Letters Patent is hereby corrected as shown below:

Title page,
Item [56], References Cited, OTHER PUBLICATIONS, "Sposili" reference, "Sequential Lateral Solidifiction" should read -- Sequential Lateral Solidification --; "Sposili" reference, "Single-Crytal Si Films Via A Low-Substrate-Temperature Excimer-Laser Crystallizaiton Method" should read -- Single-Crystal Si Films Via A Low-Substrate-Temperature Excimer-Laser Crystallization Method --; "Im" reference, "Microstructural Manipulaiton" should read -- Microstructural Manipulation --.

Column 25,
Line 64, "beani pulses" should read -- beam pulses --.

Column 26,
Line 18, "irradiated by the first beaxnlets of" should read -- irradiated by the first beamlets of --.
Line 30, "first beaxnlets to completely" should read -- first beamlets to completely --.
Line 33, "the re-solidifiedandcrystalized first areas" should read -- the re-solidified and crystalized first areas --.

Signed and Sealed this

Fourth Day of October, 2005

JON W. DUDAS
*Director of the United States Patent and Trademark Office*